(12) United States Patent
Nakao

(10) Patent No.: US 11,027,614 B2
(45) Date of Patent: Jun. 8, 2021

(54) MANAGEMENT DEVICE, ELECTRIC STORAGE DEVICE, ELECTRIC STORAGE SYSTEM AND ELECTRIC APPARATUS FOR MANAGING CHARGING AND DISCHARGING OF A PLURALITY OF ELECTRIC STORAGE CELLS CONNECTED IN SERIES

(71) Applicant: NExT-e Solutions Inc., Tokyo (JP)

(72) Inventor: Fumiaki Nakao, Shizuoka (JP)

(73) Assignee: NExT-e Solutions Inc., Tokyo (JP)

( * ) Notice: Subject to any disclaimer, the term of this patent is extended or adjusted under 35 U.S.C. 154(b) by 0 days.

(21) Appl. No.: 15/836,928

(22) Filed: Dec. 11, 2017

(65) Prior Publication Data

US 2019/0039476 A1   Feb. 7, 2019

(30) Foreign Application Priority Data

Aug. 2, 2017   (JP) .............................. JP2017-150115

(51) Int. Cl.
*H02J 7/00* (2006.01)
*B60L 11/18* (2006.01)
(Continued)

(52) U.S. Cl.
CPC ........... *B60L 11/1866* (2013.01); *B60L 58/12* (2019.02); *B60L 58/19* (2019.02); *B60L 58/21* (2019.02);
(Continued)

(58) Field of Classification Search
CPC .... B60L 11/1866; B60L 58/22; G01R 31/396; H01M 10/441; H02J 7/0019
(Continued)

(56) References Cited

U.S. PATENT DOCUMENTS 5,438,250 A * 8/1995 Retzlaff ................ H02J 7/0019
320/128
5,659,237 A * 8/1997 Divan ................... H02J 7/0018
320/119

(Continued)

FOREIGN PATENT DOCUMENTS

| JP | H11176483 A | 7/1999 |
| JP | 2011087377 A | 4/2011 |
| JP | 2013243806 A | 12/2013 |

OTHER PUBLICATIONS

"What are the advantages and disadvantages of transistor series voltage regulator?", SemiconductorForu.com, Published Online Jun. 27, 2017, Accessed Online Feb. 11, 2020, www.semiconductorforu.com/advantages-disadvantagestransistor-series-voltage-regulator/.*

(Continued)

*Primary Examiner* — John T Trischler

(57) ABSTRACT

Charging and discharging of a plurality of electric storage cells connected in series are: managed by equalizing voltages of a plurality of electric storage cells; and, without disconnecting or shifting an electrical connection between (a) the plurality of electric storage cells and (b-1) a load which uses electric power of the plurality of electric storage cells or (b-2) a charging device which charges the plurality of electric storage cells, (i) sending electric power of the plurality of electric storage cells to an external apparatus which is different from the load and the charging device, or (ii) receiving receives electric power supplied to the plurality of electric storage cells from the external apparatus.

19 Claims, 9 Drawing Sheets

(51) Int. Cl.
*H01M 10/44* (2006.01)
*G01R 31/396* (2019.01)
*B60L 58/22* (2019.01)
*B60L 58/19* (2019.01)
*B60L 58/12* (2019.01)
*G01R 31/382* (2019.01)
*B60L 58/21* (2019.01)

(52) U.S. Cl.
CPC ............ *B60L 58/22* (2019.02); *G01R 31/382* (2019.01); *G01R 31/396* (2019.01); *H01M 10/441* (2013.01); *H02J 7/0019* (2013.01); *B60L 2240/547* (2013.01)

(58) Field of Classification Search
USPC .......................................................... 320/137
See application file for complete search history.

(56) References Cited

U.S. PATENT DOCUMENTS

| | | | | |
|---|---|---|---|---|
| 5,666,041 A * | 9/1997 | Stuart | ................ | H01M 10/441 320/116 |
| 5,698,967 A * | 12/1997 | Baer | ................ | B60L 58/25 320/152 |
| 5,701,068 A * | 12/1997 | Baer | ................ | B60L 58/25 320/119 |
| 5,982,143 A * | 11/1999 | Stuart | ................ | H01M 10/441 320/119 |
| 6,043,629 A * | 3/2000 | Ashley | ................ | H02J 1/102 320/119 |
| 6,373,223 B1 * | 4/2002 | Anzawa | ................ | H02J 7/0018 320/116 |
| 6,373,226 B1 * | 4/2002 | Itou | ................ | H01M 10/441 320/132 |
| 6,583,602 B2 * | 6/2003 | Imai | ................ | H02J 7/0018 320/118 |
| 6,642,693 B2 * | 11/2003 | Anzawa | ................ | H02J 7/0018 320/118 |
| 6,670,789 B2 * | 12/2003 | Anzawa | ................ | H02J 7/0018 320/116 |
| 6,762,588 B2 * | 7/2004 | Miyazaki | ................ | B60L 50/64 320/116 |
| 6,806,685 B2 * | 10/2004 | Suzuki | ................ | H02J 7/0018 320/116 |
| 6,873,134 B2 * | 3/2005 | Canter | ................ | H02J 7/0021 320/118 |
| 6,891,352 B2 * | 5/2005 | Miyazaki | ................ | B60L 50/64 320/118 |
| 7,091,695 B2 * | 8/2006 | Miyazaki | ................ | B60L 50/64 320/116 |
| 7,193,392 B2 * | 3/2007 | King | ................ | B60L 58/15 320/118 |
| 7,245,108 B2 * | 7/2007 | Chertok | ................ | H02J 7/0016 320/132 |
| 7,378,818 B2 * | 5/2008 | Fowler | ................ | H02J 7/0016 320/119 |
| 7,528,581 B2 * | 5/2009 | Miyazaki | ................ | B60L 50/64 320/163 |
| 7,553,583 B2 * | 6/2009 | Eaves | ................ | H01M 10/425 429/61 |
| 7,723,949 B2 * | 5/2010 | Nakashima | ......... | H01M 10/425 320/106 |
| 7,745,025 B2 * | 6/2010 | Leach | ................ | H02J 7/0018 320/101 |
| 7,888,945 B2 * | 2/2011 | Miyazaki | ................ | B60L 50/64 324/434 |
| 8,098,047 B2 * | 1/2012 | Miyazaki | ................ | B60L 50/64 320/116 |
| 8,106,661 B2 * | 1/2012 | Miyazaki | ................ | H02J 7/0026 324/434 |
| 8,115,446 B2 * | 2/2012 | Piccard | ................ | H02J 7/0018 320/104 |
| 8,129,952 B2 * | 3/2012 | Lee | ................ | B60L 58/21 320/140 |
| 8,169,190 B2 * | 5/2012 | Miyazaki | ................ | B60L 50/64 320/118 |
| 8,253,378 B2 * | 8/2012 | Lee | ................ | H02J 7/0016 320/116 |
| 8,253,382 B2 * | 8/2012 | Miyazaki | ................ | B60L 50/64 320/132 |
| 8,269,462 B2 * | 9/2012 | Yamamoto | ......... | H01M 10/441 320/132 |
| 8,274,292 B2 * | 9/2012 | Minoda | ............ | H01M 8/04552 324/427 |
| 8,283,892 B2 * | 10/2012 | Miyazaki | ................ | B60L 50/64 320/134 |
| 8,294,426 B2 * | 10/2012 | Kosugi | ................ | B60L 50/51 320/117 |
| 8,330,418 B2 * | 12/2012 | Furukawa | ............ | H02J 7/0018 320/118 |
| 8,354,825 B2 * | 1/2013 | Lee | ................ | H02J 7/0018 320/116 |
| 8,410,755 B2 * | 4/2013 | Chau | ................ | B60L 3/0046 320/118 |
| 8,487,588 B2 * | 7/2013 | Yun | ................ | H01M 10/486 320/104 |
| 8,541,979 B2 * | 9/2013 | Firehammer | ......... | H02J 7/0014 320/107 |
| 8,624,549 B2 * | 1/2014 | Sridhar | ................ | B60L 53/54 320/109 |
| 8,692,515 B2 * | 4/2014 | Nakao | ................ | H02J 7/0016 320/116 |
| 8,736,229 B2 * | 5/2014 | Kawahara | ............ | B60L 3/0046 320/116 |
| 8,779,722 B2 * | 7/2014 | Lee | ................ | H02J 7/0016 320/118 |
| 8,798,832 B2 * | 8/2014 | Kawahara | ............ | H01M 10/441 701/22 |
| 8,823,323 B2 * | 9/2014 | Troxel | ............ | H01M 10/4207 320/118 |
| 8,878,492 B2 * | 11/2014 | Furukawa | ............ | H01M 10/425 320/116 |
| 8,896,273 B2 * | 11/2014 | Miyazaki | ................ | B60L 50/64 320/163 |
| 8,917,059 B2 * | 12/2014 | Nakao | ................ | H01M 10/441 320/116 |
| 8,928,283 B2 * | 1/2015 | Nakao | ................ | H01M 10/441 320/119 |
| 8,947,048 B2 * | 2/2015 | Roessler | ................ | H02J 7/0016 320/116 |
| 8,970,162 B2 * | 3/2015 | Kim | ................ | H02J 7/0019 320/103 |
| 9,006,920 B2 * | 4/2015 | Favaretto | ................ | B60K 6/48 307/9.1 |
| 9,046,584 B2 * | 6/2015 | Tsuchiya | ............ | G01R 31/3835 320/116 |
| 9,048,669 B2 * | 6/2015 | Lim | ................ | H02J 7/0019 |
| 9,048,670 B2 * | 6/2015 | Kim | ................ | H02J 7/0019 |
| 9,059,588 B2 * | 6/2015 | Nakao | ................ | H02J 7/0016 |
| 9,083,188 B2 * | 7/2015 | Nakao | ................ | H02J 7/0018 |
| 9,178,367 B2 * | 11/2015 | Nakao | ................ | H01M 10/44 |
| 9,197,076 B2 * | 11/2015 | Butzmann | ............ | H01M 10/441 |
| 9,290,904 B2 * | 3/2016 | Takeo | ................ | E02F 9/2091 |
| 9,293,928 B2 * | 3/2016 | Alexander | ............ | H02J 7/0013 |
| 9,293,937 B2 * | 3/2016 | Kawahara | ............ | H01M 10/441 |
| 9,325,178 B2 * | 4/2016 | Yun | ................ | H02J 7/0019 |
| 9,356,451 B2 * | 5/2016 | Kawahara | ............ | B60L 3/0046 |
| 9,397,507 B2 * | 7/2016 | Mercier | ................ | H02J 1/102 |
| 9,444,272 B2 * | 9/2016 | Bryngelsson | ......... | B60L 58/12 |
| 9,461,482 B2 * | 10/2016 | Cheng | ................ | H02J 7/0003 |
| 9,478,995 B2 * | 10/2016 | Hayakawa | ............ | H02J 7/0019 |
| 9,484,754 B2 * | 11/2016 | Wang | ................ | H02J 7/0016 |
| 9,537,326 B2 * | 1/2017 | Troxel | ............ | H01M 10/4207 |
| 9,620,987 B2 * | 4/2017 | Alexander | ............ | H02J 7/0013 |
| 9,696,383 B2 * | 7/2017 | Kikuchi | ................ | H01M 10/441 |
| 9,728,820 B2 * | 8/2017 | Diamond | ............ | B60L 58/16 |
| 9,780,591 B2 * | 10/2017 | Deokar | ................ | H02M 3/33561 |
| 9,853,461 B2 * | 12/2017 | Kubota | ................ | H02J 7/0014 |
| 9,893,547 B2 * | 2/2018 | Wu | ................ | H02J 7/0029 |

(56) References Cited

U.S. PATENT DOCUMENTS

| | | | | |
|---|---|---|---|---|
| 9,997,931 B2* | 6/2018 | Mercier | H02J 7/0018 |
| 10,131,245 B2* | 11/2018 | Hand, III | B60L 58/13 |
| 10,230,246 B2* | 3/2019 | Troxel | H01M 10/4207 |
| 10,256,513 B2* | 4/2019 | Sakabe | H01M 10/48 |
| 10,293,693 B2* | 5/2019 | Kim | H02J 7/0068 |
| 10,730,398 B2* | 8/2020 | Kim | H02J 7/0047 |
| 2002/0109482 A1* | 8/2002 | Anzawa | H02J 7/0018 320/119 |
| 2002/0167291 A1* | 11/2002 | Imai | H02J 7/0018 320/119 |
| 2003/0044689 A1* | 3/2003 | Miyazaki | B60L 50/64 429/320 |
| 2003/0141843 A1* | 7/2003 | Anzawa | H02J 7/0018 320/118 |
| 2003/0152830 A1* | 8/2003 | Eaves | H01M 10/425 429/156 |
| 2004/0135544 A1* | 7/2004 | King | B60L 58/22 320/116 |
| 2004/0135545 A1* | 7/2004 | Fowler | H02J 7/0018 320/118 |
| 2004/0135546 A1* | 7/2004 | Chertok | H01M 10/441 320/118 |
| 2004/0178768 A1* | 9/2004 | Miyazaki | B60L 50/64 320/116 |
| 2005/0242775 A1* | 11/2005 | Miyazaki | B60L 50/64 320/116 |
| 2006/0193095 A1* | 8/2006 | Hunter | H02J 7/0019 361/64 |
| 2007/0018613 A1* | 1/2007 | Miyazaki | H02J 7/0026 320/116 |
| 2007/0080661 A1* | 4/2007 | Nakashima | H01M 10/425 320/107 |
| 2007/0190369 A1* | 8/2007 | Leach | H02J 7/0018 429/9 |
| 2008/0061740 A1* | 3/2008 | Miyazaki | B60L 50/64 320/116 |
| 2008/0067978 A1* | 3/2008 | Miyazaki | B60L 50/64 320/116 |
| 2008/0079395 A1* | 4/2008 | Miyazaki | B60L 50/64 320/118 |
| 2008/0191663 A1* | 8/2008 | Fowler | B60L 53/11 320/118 |
| 2009/0128087 A1* | 5/2009 | Ohmori | H01M 10/42 320/101 |
| 2009/0169987 A1* | 7/2009 | Miyazaki | B60L 50/64 429/158 |
| 2009/0206667 A1* | 8/2009 | Holliday | F02G 1/0435 307/48 |
| 2009/0246596 A1* | 10/2009 | Sridhar | B60L 53/54 429/513 |
| 2009/0261781 A1* | 10/2009 | Miyazaki | B60L 50/64 320/116 |
| 2009/0278496 A1* | 11/2009 | Nakao | H02J 7/0016 320/118 |
| 2009/0284223 A1* | 11/2009 | Miyazaki | B60L 50/64 320/116 |
| 2009/0284224 A1* | 11/2009 | Miyazaki | B60L 50/64 320/118 |
| 2009/0302802 A1* | 12/2009 | Miyazaki | B60L 50/64 320/116 |
| 2010/0019753 A1* | 1/2010 | Ikeda | H02M 3/158 323/311 |
| 2010/0117593 A1* | 5/2010 | Piccard | H02J 7/0018 320/104 |
| 2010/0207579 A1* | 8/2010 | Lee | H02J 7/0018 320/120 |
| 2010/0231178 A1* | 9/2010 | Handa | H02J 7/0065 320/163 |
| 2010/0315043 A1* | 12/2010 | Chau | B60L 3/0046 320/134 |
| 2011/0025271 A1* | 2/2011 | Yamamoto | H01M 10/441 320/118 |
| 2011/0080139 A1* | 4/2011 | Troxel | H01M 10/4207 320/134 |
| 2011/0084663 A1* | 4/2011 | Troxel | H01M 10/4207 320/118 |
| 2011/0084668 A1* | 4/2011 | Nakao | H01M 10/441 320/149 |
| 2011/0089898 A1* | 4/2011 | Lee | H02J 7/0016 320/116 |
| 2011/0100735 A1* | 5/2011 | Flett | B60K 6/46 180/65.22 |
| 2011/0109270 A1* | 5/2011 | Nakao | H01M 10/441 320/116 |
| 2011/0115436 A1* | 5/2011 | Zhang | H01M 10/44 320/134 |
| 2011/0121784 A1* | 5/2011 | Yun | H01M 10/486 320/118 |
| 2011/0234164 A1* | 9/2011 | Furukawa | H02J 7/0018 320/118 |
| 2011/0309795 A1* | 12/2011 | Firehammer | H02J 7/0014 320/116 |
| 2011/0309796 A1* | 12/2011 | Firehammer | H02J 7/0018 320/118 |
| 2011/0313613 A1* | 12/2011 | Kawahara | H01M 10/441 701/34.4 |
| 2011/0316520 A1* | 12/2011 | Kawahara | B60L 3/0046 323/351 |
| 2012/0001480 A1* | 1/2012 | Favaretto | B60K 6/48 307/9.1 |
| 2012/0086390 A1* | 4/2012 | Lim | H02J 7/0019 320/107 |
| 2012/0249074 A1* | 10/2012 | Tsuchiya | G01R 31/3835 320/116 |
| 2012/0286734 A1* | 11/2012 | Miyazaki | B60L 50/64 320/118 |
| 2012/0292987 A1* | 11/2012 | Rutkowski | B60R 25/00 307/9.1 |
| 2013/0002016 A1* | 1/2013 | Furukawa | H01M 10/425 307/9.1 |
| 2013/0015820 A1* | 1/2013 | Kim | H02J 7/0019 320/128 |
| 2013/0015821 A1* | 1/2013 | Kim | H02J 7/0019 320/128 |
| 2013/0026991 A1* | 1/2013 | Roessler | H02J 7/0016 320/116 |
| 2013/0181680 A1* | 7/2013 | Chau | B60L 3/0046 320/134 |
| 2013/0342156 A1* | 12/2013 | Nakao | H02J 7/0016 320/104 |
| 2014/0009092 A1* | 1/2014 | Ma | B60L 58/15 318/139 |
| 2014/0009116 A1* | 1/2014 | Nakao | H01M 10/425 320/116 |
| 2014/0015475 A1* | 1/2014 | Nakao | H02J 7/0018 320/103 |
| 2014/0042815 A1* | 2/2014 | Maksimovic | H02J 1/00 307/63 |
| 2014/0042973 A1* | 2/2014 | Kawahara | H01M 10/441 320/118 |
| 2014/0042974 A1* | 2/2014 | Yang | H01M 10/441 320/119 |
| 2014/0049206 A1* | 2/2014 | Sridhar | H01M 10/46 320/101 |
| 2014/0084868 A1* | 3/2014 | Yun | H02J 7/0063 320/118 |
| 2014/0159671 A1* | 6/2014 | Kawahara | B60L 3/0046 320/134 |
| 2014/0217982 A1* | 8/2014 | Ohkawa | H02J 7/0016 320/118 |
| 2014/0232346 A1* | 8/2014 | Zhang | H01M 10/44 320/118 |
| 2014/0239878 A1* | 8/2014 | Yun | H02J 7/0019 320/103 |
| 2014/0312685 A1* | 10/2014 | Moga | G01R 31/52 307/9.1 |
| 2014/0312844 A1* | 10/2014 | Mercier | H02J 1/102 320/118 |

(56) References Cited

U.S. PATENT DOCUMENTS

| | | | | |
|---|---|---|---|---|
| 2014/0312848 A1* | 10/2014 | Alexander | H02J 7/0013 | 320/134 |
| 2014/0340023 A1* | 11/2014 | Shu | H02J 7/0018 | 320/107 |
| 2014/0354291 A1* | 12/2014 | Kikuchi | H01M 10/441 | 324/434 |
| 2015/0002083 A1* | 1/2015 | Nakao | H01M 10/44 | 320/107 |
| 2015/0002084 A1* | 1/2015 | Nakao | H01M 10/44 | 320/107 |
| 2015/0069960 A1* | 3/2015 | Kuraishi | B60L 58/12 | 320/107 |
| 2015/0295420 A1* | 10/2015 | Cheng | H02J 7/0003 | 320/128 |
| 2015/0295425 A1* | 10/2015 | Bryngelsson | B60L 58/12 | 320/126 |
| 2016/0028256 A1* | 1/2016 | Kubota | H02J 7/0014 | 320/118 |
| 2016/0126758 A1* | 5/2016 | Wu | H02J 7/0029 | 320/162 |
| 2016/0126781 A1* | 5/2016 | Alexander | H02J 7/0013 | 320/108 |
| 2016/0197498 A1* | 7/2016 | Mercier | H02J 7/0018 | 320/118 |
| 2016/0294204 A1* | 10/2016 | Deokar | H02M 3/33561 | |
| 2016/0311328 A1* | 10/2016 | Kim | H02J 7/0068 | |
| 2017/0084959 A1* | 3/2017 | Nakao | H01M 10/441 | |
| 2017/0288422 A1* | 10/2017 | Yang | H01M 10/441 | |
| 2017/0351561 A1* | 12/2017 | Yamazoe | B60L 58/21 | |
| 2017/0366005 A1* | 12/2017 | Isshiki | H02J 7/0016 | |
| 2018/0109120 A1* | 4/2018 | Nakao | H01M 10/44 | |
| 2018/0233787 A1* | 8/2018 | Kubota | H01M 10/425 | |
| 2018/0358662 A1* | 12/2018 | Kurosaki | H02J 7/0047 | |
| 2019/0232801 A1* | 8/2019 | Kim | B60L 50/50 | |

OTHER PUBLICATIONS

Linear Technology Corporation, "LTC3300-1—High Efficiency Bidirectional Multicell Battery Balancer", [Online], [Retrieved on Jul. 13, 2017], Internet, <URL: http://www.linear.com/product/LTC3300-1>.

* cited by examiner

MANAGEMENT DEVICE, ELECTRIC STORAGE DEVICE, ELECTRIC STORAGE SYSTEM AND ELECTRIC APPARATUS FOR MANAGING CHARGING AND DISCHARGING OF A PLURALITY OF ELECTRIC STORAGE CELLS CONNECTED IN SERIES

The contents of the following Japanese patent application are incorporated herein by reference:

2017-150115 filed on Aug. 2, 2017

BACKGROUND

1. Technical Field

The present invention relates to a management device, an electric storage device, an electric storage system and an electric apparatus.

2. Related Art

Battery modules are known, which include: an assembled battery having a plurality of electric storage cells connected in series; and an equalization circuit that equalizes the voltages of the plurality of electric storage cells in the assembled battery (see patent documents 1-3 and non-patent document 1). Recently, battery packs including a plurality of battery modules connected in series have come to be used.

Patent Document 1: Japanese Patent Application Publication No. Hei. 11-176483
Patent Document 2: Japanese Patent Application Publication No. 2011-087377
Patent Document 3: Japanese Patent Application Publication No. 2013-243806
Non-Patent Document 1: Linear Technology Corporation, "LTC3300-1-High Efficiency Bidirectional Multicell Battery Balancer", [Online], [Retrieved on Jul. 13, 2017], Internet, <URL: http://www.linear.com/product/LTC3300-1>

In some cases, battery modules in a battery pack may be arranged at different positions in an electric apparatus, and battery modules having different numbers of electric storage cells or different rated voltages may be used to construct a battery pack. Use of a plurality of battery modules in different environments may result in differences in deterioration condition between the battery modules. It is also desired to reduce the trouble and cost for managing battery modules.

SUMMARY

A first aspect of the present invention provides a management device. For example, the management device manages charging and discharging of a plurality of electric storage cells connected in series. For example, the management device includes an equalization unit which equalizes voltages of the plurality of electric storage cells. For example, the management device includes an electricity sending/receiving unit which, without disconnecting or shifting an electrical connection between (a) the plurality of electric storage cells and (b-1) a load which uses electric power of the plurality of electric storage cells or (b-2) a charging device which charges the plurality of electric storage cells, (i) sends electric power of the plurality of electric storage cells to an external apparatus which is different from the load and the charging device, or (ii) receives electric power supplied to the plurality of electric storage cells from the external apparatus.

According to the management device, the external apparatus may include one or more electric storage cells which are arranged between (a) the plurality of electric storage cells and (b-1) the load or (b-2) the charging device, and are connected in series to the plurality of electric storage cells. According to the management device, the electricity sending/receiving unit may include a voltage adjusting unit which adjusts a voltage to be sent or received to any value. According to the management device, the electricity sending/receiving unit may start sending or receiving electricity in response to receiving a signal for starting sending or receiving electricity. According to the management device, the electricity sending/receiving unit may stop sending or receiving electricity in response to receiving a signal for stopping sending or receiving electricity. According to the management device, the electricity sending/receiving unit may include an insulated bidirectional DC-DC converter.

The management device may include a storage unit which stores first identification information and second identification information provided to each the plurality of electric storage cells. The management device may include an identification information converting unit which, in reference to information stored in the storage unit, converts the first identification information included in a signal received from an external component into the second identification information, and converts the second identification information included in a signal to be sent to the external component into the first identification information. According to the management device, the second identification information provided to each of the plurality of electric storage cells may be different from each other. According to the management device, the first identification information provided to each of the plurality of electric storage cells may be (i) entirely different from the second identification information. According to the management device, the first identification information provided to each of the plurality of electric storage cells may be (ii) entirely identical to the second identification information.

A second aspect of the present invention provides an electric storage device. For example, the electric storage device includes the plurality of electric storage cells. For example, the electric storage device includes the management device according to the first aspect.

A third aspect of the present invention provides an electric storage system. For example, the electric storage system includes a plurality of electric storage devices, each being the electric storage device according to the second aspect. For example, the electric storage system includes an electric power line electrically connected to the electricity sending/receiving unit in each electric storage device so as to allow electric power to be transmitted between any electric storage devices. For example, the electric storage system includes a control unit which controls the electricity sending/receiving unit in at least one of the electric storage devices. According to the electric storage system, for example, the plurality of electric storage cells in each electric storage device are connected in series.

According to the electric storage system, rated voltages of a first electric storage device and a second electric storage device constituting the plurality of electric storage devices may be different from each other. According to the electric storage system, a number of the plurality of electric storage cells included in a first electric storage device constituting the plurality of electric storage devices and a number of the plurality of electric storage cells included in a second electric storage device constituting the plurality of electric storage devices may be different from each other. According to the electric storage system, the electricity sending/receiving unit in at least one of the first electric storage device and the second electric storage device may include a bidirectional DC-DC converter.

According to the electric storage system, the first electric storage device may be one of the plurality of electric storage devices that is arranged on a most negative pole side. According to the electric storage system, a positive pole end and a negative pole end of the plurality of electric storage cells in the first electric storage device may be physically connected to the electric power line and always electrically connected to the electric power line.

According to the electric storage system, the control unit may include a determining unit which determines, based on a voltage or State of Charge (SOC) of each of the plurality of electric storage cells included in each of the plurality of electric storage devices, (i) an electric storage device that sends electricity to the electric power line and (ii) an electric storage device that receives electricity from the electric power line, selecting from the plurality of electric storage devices. According to the electric storage system, the control unit may include an instruction generating unit which generates at least one of (i) an instruction to cause the electricity sending/receiving unit in the electric storage device that sends electricity to the electric power line to start an electricity sending operation, and (ii) an instruction to cause the electricity sending/receiving unit in the electric storage device that receives electricity from the electric power line to start an electricity receiving operation.

According to the electric storage system, the determining unit may determine, based on a voltage or State of Charge (SOC) of each of the plurality of electric storage cells included in each of the plurality of electric storage devices, at least one of (i) an electric storage device that stops the electricity sending operation and (ii) an electric storage device that stops the electricity receiving operation. According to the electric storage system, the instruction generating unit may generate at least one of (i) an instruction to cause the electricity sending/receiving unit in the electric storage device that stops the electricity sending operation to stop an electricity sending operation, and (ii) an instruction to cause the electricity sending/receiving unit in the electric storage device that stops the electricity receiving operation to stop an electricity receiving operation.

A fourth aspect of the present invention provides an electric storage system. For example, the electric storage system includes a plurality of electric storage devices. For example, the electric storage system includes a control unit which controls each of the plurality of electric storage devices. According to the electric storage system, for example, each of the plurality of electric storage devices includes a plurality of electric storage cells connected in series. According to the electric storage system, for example, each of the plurality of electric storage devices includes an equalization unit which equalizes voltages of the plurality of electric storage cells. According to the electric storage system, for example, each of the plurality of electric storage devices includes a storage unit which stores first identification information and second identification information provided to each of the plurality of electric storage cells. According to the electric storage system, for example, each of the plurality of electric storage devices includes an identification information converting unit which, in reference to information stored in the storage unit, converts the first identification information included in a signal received from the control unit into the second identification information, and converts the second identification information included in a signal to be sent to the control unit into the first identification information. According to the electric storage system, for example, the plurality of electric storage cells in each electric storage device are connected in series. According to the electric storage system, for example, the first identification information provided to each of the plurality of electric storage cells is different from each other. According to the electric storage system, for example, the first identification information provided to each of the plurality of electric storage cells is (i) entirely different from the second identification information or (ii) entirely identical to the second identification information.

According to the electric storage system, in at least one of the plurality of electric storage devices, the equalization unit and both of the storage unit and the identification information converting unit may be arranged in physically different housings. According to the electric storage system, in at least one of the plurality of electric storage devices, the equalization unit and both of the storage unit and the identification information converting unit may be arranged on physically different substrates. According to the electric storage system, at least two of the plurality of electric storage devices may be connected in parallel. According to the electric storage system, at least two of the plurality of electric storage devices may be connected in series.

A fifth aspect of the present invention provides an electric apparatus. For example, the electric apparatus includes the electric storage system according to the third aspect or the fourth aspect. For example, the electric apparatus includes a load which uses electric power of the electric storage system.

The summary clause does not necessarily describe all necessary features of the embodiments of the present invention. The present invention may also be a sub-combination of the features described above.

DESCRIPTION OF EXEMPLARY EMBODIMENTS

Figure 1:
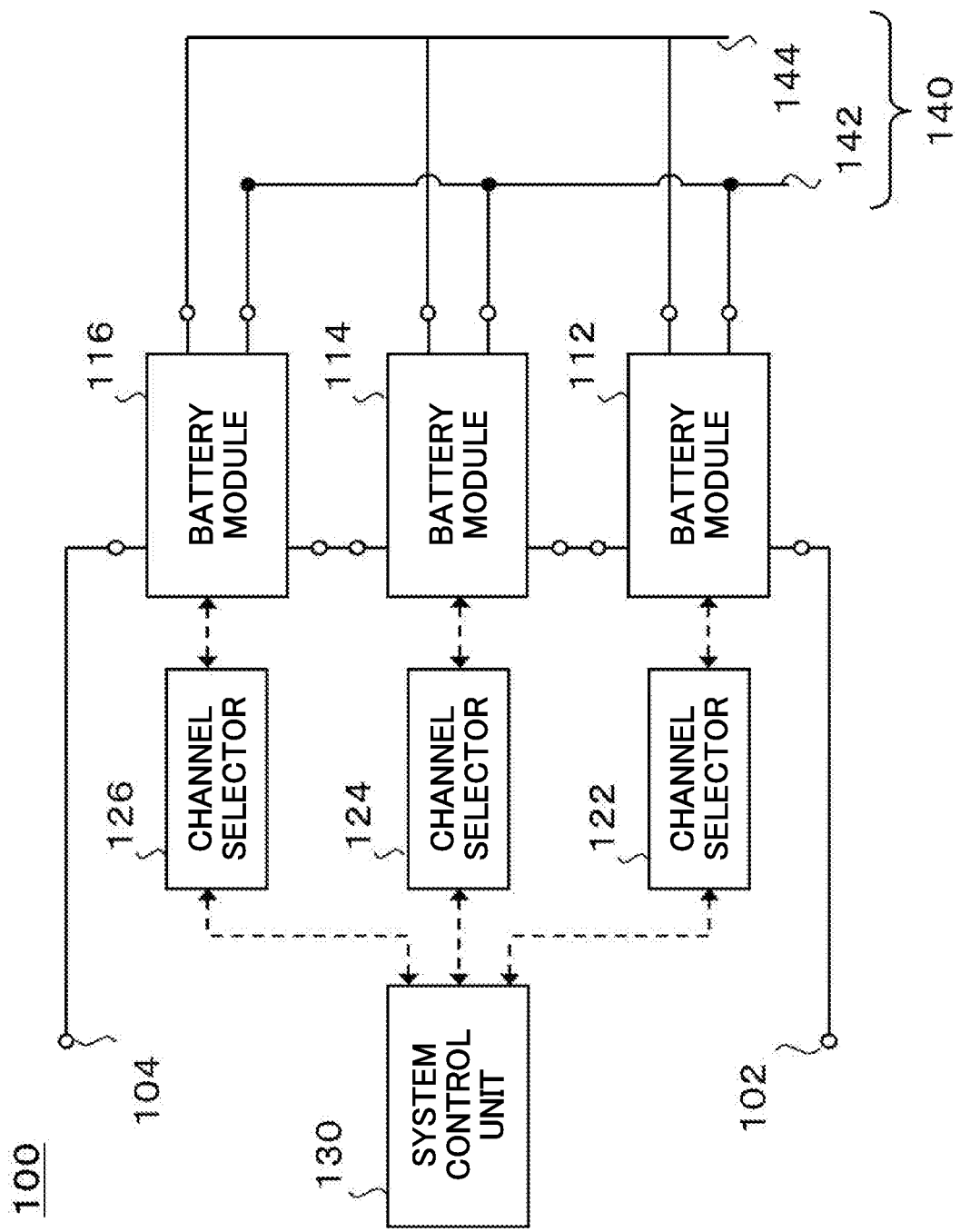
FIG. 1 schematically shows an example of the system configuration of a battery pack 100.

Hereinafter, embodiments of the present invention will be described. The embodiments do not limit the invention according to the claims, and all the combinations of the features described in the embodiments are not necessarily essential to means provided by aspects of the invention.

Also, the embodiments will be described with reference to the drawings, and the same or like parts illustrated in the drawings may be marked with the same reference numerals to omit overlapping descriptions.

FIG. 1 schematically shows an example of the system configuration of a battery pack 100. In this embodiment, the battery pack 100 includes a terminal 102, a terminal 104, a battery module 112, a battery module 114, a battery module 116, a channel selector 122, a channel selector 124, a channel selector 126, a system control unit 130 and an electric power transmitting bus 140. In this embodiment, the electric power transmitting bus 140 includes a low potential bus 142 and a high potential bus 144.

For simplicity of description, this embodiment describes a case where the battery pack 100 includes three battery modules. However, the battery pack 100 is not limited by this embodiment. In another embodiment, the battery pack 100 may include two battery modules. In yet another embodiment, the battery pack 100 may include four or more battery modules.

The battery pack 100 may not include at least some of the components described in relation to FIG. 1. In an embodiment, the battery pack 100 includes the battery module 112, the battery module 114, the battery module 116, the system control unit 130 and the electric power transmitting bus 140. In another embodiment, the battery pack 100 includes the battery module 112, the battery module 114, the battery module 116, the channel selector 124, the channel selector 126 and the system control unit 130.

The battery pack 100 may be an example of an electric storage system. Each of the battery module 112, the battery module 114 and the battery module 116 may be an example of an electric storage device. The battery module 112, the battery module 114 and the battery module 116 may be an example of at least two electric storage devices or a plurality of electric storage devices. The battery module 112, the battery module 114 and the battery module 116 may be an example of an external apparatus. The channel selector 122, the channel selector 124 and the channel selector 126 may be an example of a storage unit and an identification information converting unit. The system control unit 130 may be an example of a control unit. The electric power transmitting bus 140 may be an example of an electric power line. The low potential bus 142 may be an example of an electric power line. The high potential bus 144 may be an example of an electric power line.

In this embodiment, the battery pack 100 supplies electric power to an external apparatus which uses electric power (which may be referred to as load). This may be referred to as discharging of the battery pack 100. The battery pack 100 stores electric power supplied from an external apparatus. This may be referred to as charging of the battery pack 100. For example, the battery pack 100 stores regenerated electric power from a load. The battery pack 100 may store electric power supplied from a charging device. In this embodiment, the terminal 102 and the terminal 104 electrically connect the battery pack 100 to an external apparatus.

Here, the phrase "electrically connected" does not necessarily mean that a first element and a second element are directly connected. A third element may intervene between a first element and a second element. Also, the phrase "electrically connected" does not necessarily mean that a first element and a second element are physically connected. For example, input windings and output windings in a transformer are not physically connected, but they are electrically connected. Further, the phrase "electrically connected" does not only mean that a first element and a second element are electrically connected in actuality, but also means that a first element and a second element are electrically connected when an electric storage cell and a balance correction circuit are electrically connected.

Note that the phrase "connected in series" means that a first element and a second element are electrically connected in series. Also, unless specifically stated otherwise, the "voltage difference" between electric storage cells refers to a value obtained by, when the voltages (which may be referred to as inter-terminal voltages) of two electric storage cells are compared, subtracting the voltage of the electric storage cell having a lower voltage from the voltage of the electric storage cell having a higher voltage.

In this embodiment, at least one of the battery module 112, the battery module 114 and the battery module 116 includes a plurality of electric storage cells connected in series. Each of the battery module 112, the battery module 114 and the battery module 116 may include a plurality of electric storage cells connected in series. At least one of the battery module 112, the battery module 114 and the battery module 116 may further include one or more electric storage cells connected in parallel to a plurality of electric storage cells connected in series included in each module.

In this embodiment, at least one of the battery module 112, the battery module 114 and the battery module 116 may include an apparatus or element which manages charging and discharging of a plurality of electric storage cells included in each module. Each of the battery module 112, the battery module 114 and the battery module 116 may include an apparatus or element which manages charging and discharging of a plurality of electric storage cells included in each module. Each of the battery module 112, the battery module 114 and the battery module 116 may include (i) a plurality of electric storage cells connected in series and (ii) an apparatus or element which manages charging and discharging of the plurality of electric storage cells. (i) The plurality of electric storage cells connected in series and (ii) the apparatus or element which manages charging and discharging of the plurality of electric storage cells may be arranged in physically the same housing.

In this embodiment, the plurality of electric storage cells included in the battery module 112, the plurality of electric storage cells included in the battery module 114 and the plurality of electric storage cells included in the battery module 116 are connected in series. In this embodiment, the plurality of electric storage cells included in the battery module 112, the plurality of electric storage cells included in the battery module 114 and the plurality of electric storage cells included in the battery module 116 are connected in series such that the battery module 112 is at a lower potential and the battery module 116 is at a higher potential.

In this embodiment, each of the battery module 112, the battery module 114 and the battery module 116 is arranged between another battery module and the terminal 102 or the terminal 104. In this manner, between a plurality of electric storage cells included in each of the battery module 112, the battery module 114 and the battery module 116 and a load or a charging device, one or more electric storage cells included in another module are arranged.

The rated voltage of one of the battery module 112, the battery module 114 and the battery module 116 and the rated voltage of another one of the battery module 112, the battery module 114 and the battery module 116 may be the same, or may be different from each other. The number of a plurality of electric storage cells included in one of the battery module 112, the battery module 114 and the battery module 116 and the number of a plurality of electric storage cells included in another one of the battery module 112, the battery module 114 and the battery module 116 may be the same, or may be different from each other.

In this embodiment, at least one of the channel selector 122, the channel selector 124 and the channel selector 126 includes, for example, a storage unit which stores first identification information and second identification information provided to each of a plurality of electric storage cells included in the corresponding battery module. At least one of the channel selector 122, the channel selector 124 and the channel selector 126 includes, for example, an identification information converting unit which, in reference to the information stored in the storage unit described above, converts the first identification information included in a signal received from an external component (the system control unit 130, for example) into the second identification information, and converts the second identification information included in a signal to be sent to an external component (the system control unit 130, for example) into the first identification information.

The second identification information provided to each of the plurality of electric storage cells is preferably different from each other. In an embodiment, the first identification information provided to each of the plurality of electric storage cells is entirely different from the second identification information. In another embodiment, the first identification information provided to each of the plurality of electric storage cells is entirely identical to the second identification information.

The first identification information may be information for identifying, by the system control unit 130, each of all the electric storage cells included in the battery pack 100. The second identification information may be information for identifying, by an apparatus or element to manage charging and discharging included in a corresponding battery module, each of the plurality of electric storage cells included in the corresponding battery module.

In this embodiment, the channel selector 122, the channel selector 124 and the channel selector 126 are arranged corresponding to, respectively, the battery module 112, the battery module 114 and the battery module 116. For example, if each of the battery module 112, the battery module 114 and the battery module 116 includes ten electric storage cells connected in series, the system control unit 130 assigns numbers of 1-10 to respective electric storage cells in the battery module 112, assigns numbers of 11-20 to respective electric storage cells in the battery module 114, and assigns numbers of 21-30 to respective electric storage cells in the battery module 116.

In this case, for example, the channel selector 122 stores the numbers of 1-10 as first identification information of respective electric storage cells in the battery module 112, and stores the numbers of 1-10 as second identification information of respective electric storage cells in the battery module 112. For example, the channel selector 124 stores the numbers of 11-20 as first identification information of respective electric storage cells in the battery module 114, and stores the numbers of 1-10 as second identification information of respective electric storage cells in the battery module 114. For example, the channel selector 126 stores the numbers of 21-30 as first identification information of respective electric storage cells in the battery module 116, and stores the numbers of 1-10 as second identification information of respective electric storage cells in the battery module 116.

In managing the stock of the battery modules, if the battery pack 100 does not include the channel selectors, it is needed to manage each of the stock of the battery module 112, the stock of the battery module 114 and the stock of the battery module 116 as an individual battery module. However, if the battery pack 100 includes the channel selectors, it is possible to manage at least the stock of the battery module 114 and the stock of the battery module 116 as the same battery module. In this manner, standardization of the battery modules can be advanced, and the trouble and cost of managing the battery modules can be reduced.

In this embodiment, the system control unit 130 controls the battery pack 100. The system control unit 130 may manage the condition of the battery pack 100. For example, the system control unit 130 manages at least one of the voltages and States of Charge (which may be referred to as SOCs) of the battery module 112, the battery module 114 and the battery module 116.

The system control unit 130 may collect information indicating at least one of the voltages and States of Charge of the battery module 112, the battery module 114 and the battery module 116. The system control unit 130 may manage the variation between the battery module 112, the battery module 114 and the battery module 116 in at least one of their voltages and States of Charge. The system control unit 130 may control the battery pack 100 such that the variation between the battery module 112, the battery module 114 and the battery module 116 in at least one of their voltages and States of Charge satisfies a predetermined condition. Examples of the predetermined condition can include a condition that the above-described variation is smaller than a predetermined threshold, a condition that the above-described variation is within a predetermined range, and the like.

In this embodiment, the electric power transmitting bus 140 transmits electric power between any battery modules. If is not needed to transmit electric power between any battery modules, the low potential bus 142 and the high potential bus 144 may be electrically insulated. If electric power is to be transmitted between any battery modules, the low potential bus 142 and the high potential bus 144 may be electrically connected. A timing to transmit electric power between any battery modules is determined by, for example, the system control unit 130.

Figure 2:
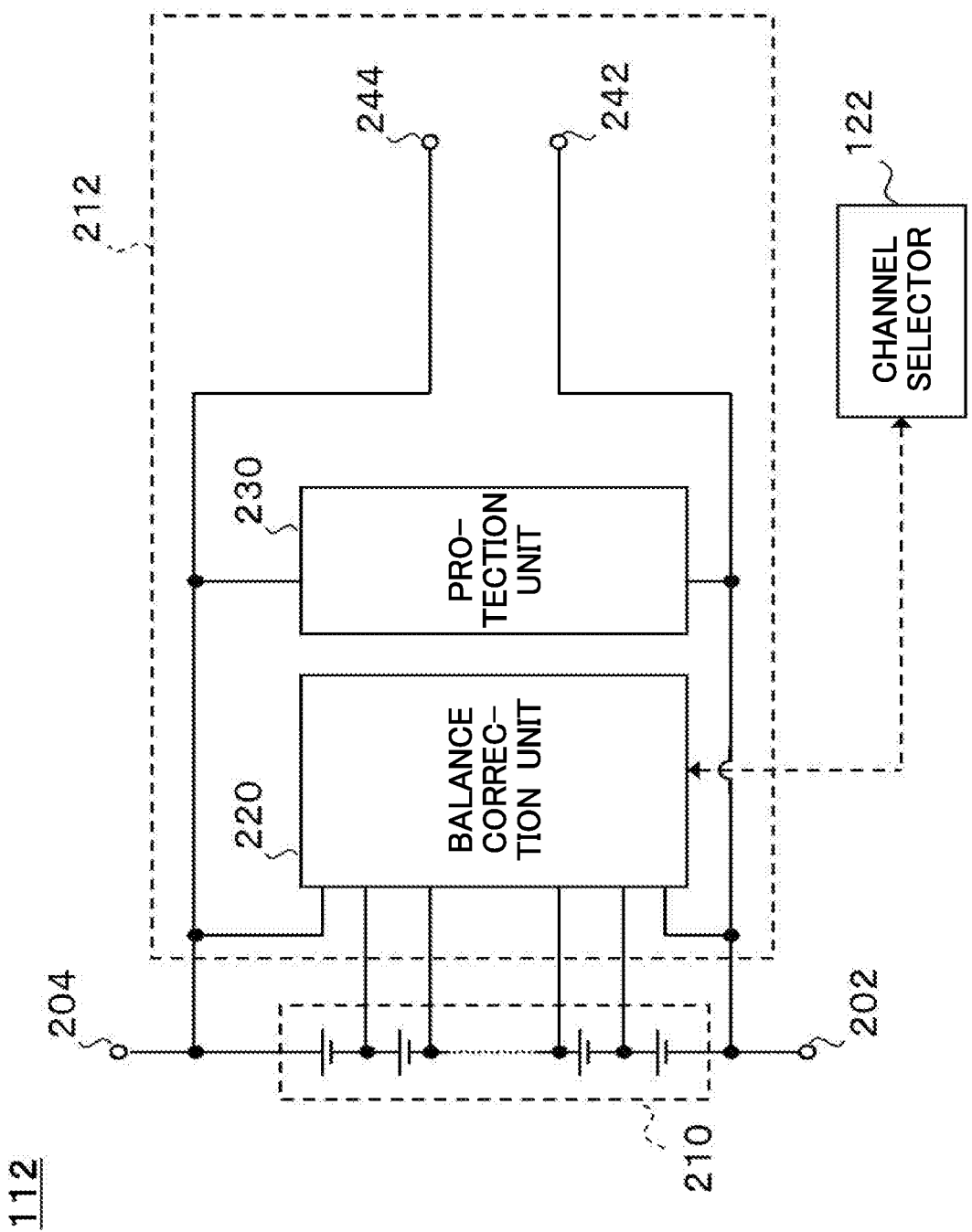
FIG. 2 schematically shows an example of the internal configuration of a battery module 112.

FIG. 2 schematically shows an example of the internal configuration of the battery module 112. In this embodiment, the battery module 112 includes a terminal 202, a terminal 204, an assembled battery 210 and a voltage managing unit 212. In this embodiment, the voltage managing unit 212 includes a balance correction unit 220, a protection unit 230, a terminal 242 and a terminal 244.

The battery module 112 may be an example of a first electric storage device. The terminal 202 may be an example of a negative pole end. The terminal 204 may be an example of a positive pole end. The assembled battery 210 may be an example of a plurality of electric storage cells. The voltage managing unit 212 may be an example of a management device. The balance correction unit 220 may be an example of an equalization unit. The terminal 242 and the terminal 244 may be an example of an electricity sending/receiving unit.

In this embodiment, the terminal 202 is electrically connected to the terminal 102. In this embodiment, the terminal 204 is electrically connected to the electric storage cells in the battery module 114. In this embodiment, the assembled battery 210 includes a plurality of electric storage cells. In this embodiment, one end of the assembled battery 210 at its negative pole side is electrically connected to the terminal 202, and one end of the assembled battery 210 at its positive pole side is electrically connected to the terminal 204.

The electric storage cells constituting the assembled battery 210 may be secondary batteries or capacitors. Examples of the type of the secondary batteries can include lithium batteries, lithium-ion batteries, lithium-sulfur batteries, sodium-sulfur batteries, lead-acid batteries, nickel-hydrogen batteries, nickel-cadmium batteries, redox flow batteries, metal-air batteries and the like. The type of the lithium-ion batteries is not particularly limited. Examples of the type of the lithium-ion batteries can include iron phosphate-based, manganese-based, cobalt-based, nickel-based and ternary batteries and the like.

The electric storage cells constituting the assembled battery 210 may further include a plurality of electric storage cells. In an embodiment, a single electric storage cell includes a plurality of electric storage cells connected in series. In another embodiment, a single electric storage cell includes a plurality of electric storage cells connected in parallel. In yet another embodiment, a single electric storage cell includes a plurality of electric storage cells connected in a matrix manner.

In this embodiment, the voltage managing unit 212 manages charging and discharging of the assembled battery 210. In this embodiment, the balance correction unit 220 equalizes the voltages of the assembled battery 210. The balance correction unit 220 may send/receive information to/from the system control unit 130. The balance correction unit 220 may send/receive information to/from the system control unit 130 via the channel selector 122.

The balance correction unit 220 and the channel selector 122 may be arranged in physically the same housing. The balance correction unit 220 and the channel selector 122 may be arranged in physically different housings. The balance correction unit 220 and the channel selector 122 may be arranged on physically the same substrate. The balance correction unit 220 and the channel selector 122 may be arranged on physically different substrates. Details of an embodiment of the balance correction unit 220 will be described later.

The protection unit 230 protects the assembled battery 210 from experiencing at least one of overcurrent, overvoltage and overdischarge. For example, a known overcurrent/overvoltage protection circuit such as disclosed in Japanese Patent Application Publication No. 2009-183141 can be used as the protection unit 230.

In this embodiment, the terminal 242 is electrically connected to the low potential bus 142. Also, the terminal 242 is electrically connected to the negative pole end of the assembled battery 210. In this embodiment, the terminal 244 is electrically connected to the high potential bus 144. Also, the terminal 244 is electrically connected to the positive pole end of the assembled battery 210. In this embodiment, the positive pole end and negative pole end of the assembled battery 210 in the battery module 112 are physically connected to the electric power transmitting bus 140. In this manner, the positive pole end and negative pole end of the assembled battery 210 in the battery module 112 are always electrically connected to the electric power transmitting bus 140.

In this manner, the assembled battery 210 in the battery module 112 can send/receive electric power to/from at least one of the other battery modules via the terminal 242 and the terminal 244 and the electric power transmitting bus 140. For example, the terminal 242 and the terminal 244, without disconnecting or shifting an electrical connection between (a) the assembled battery 210 and (b-1) a load which uses electric power of the assembled battery 210 or (b-2) a charging device which charges the assembled battery 210, (i) send electric power of the assembled battery 210 to at least one of the battery module 114 and the battery module 116, or (ii) receive electric power supplied to the assembled battery 210 from at least one of the battery module 114 and the battery module 116.

Figure 3:
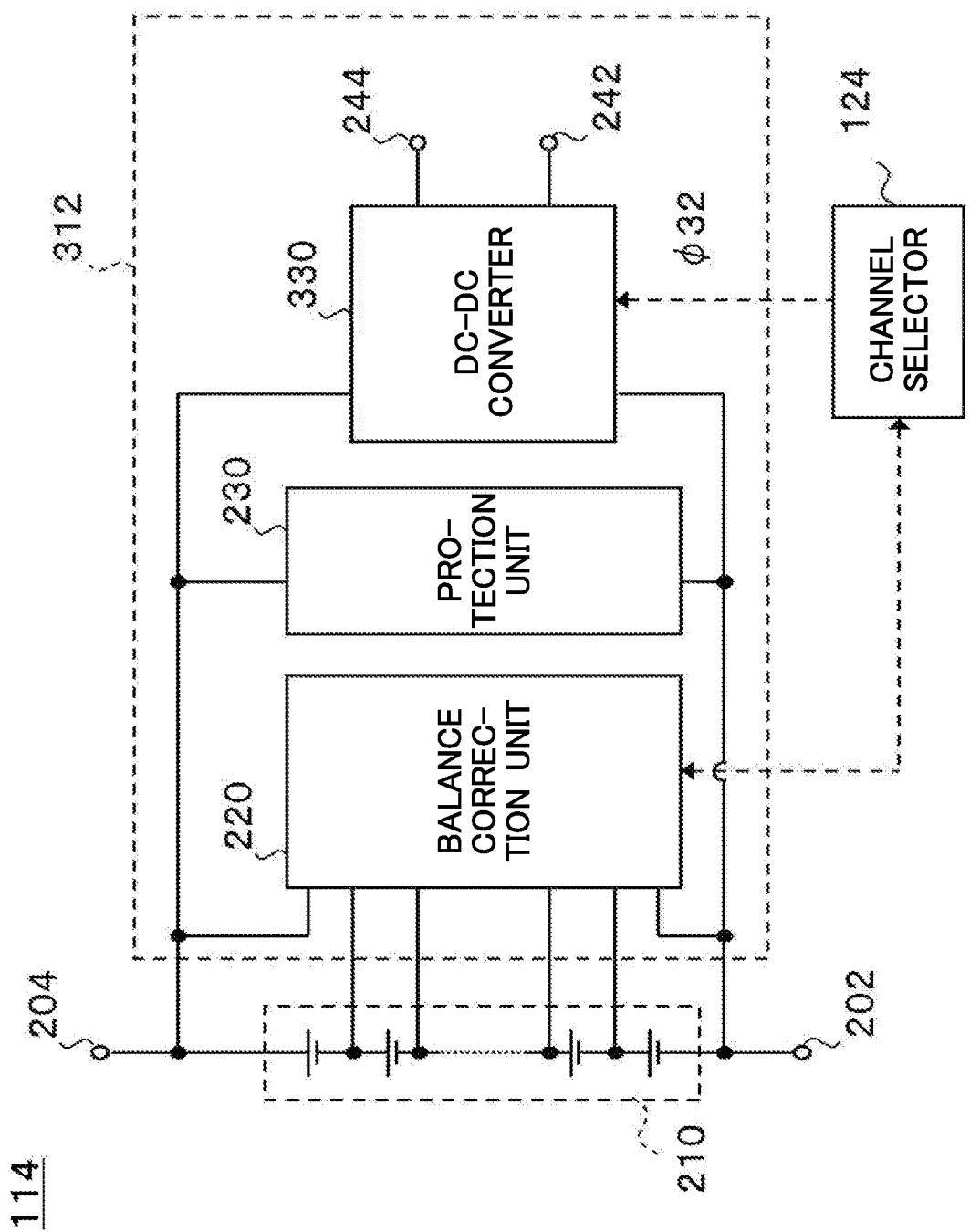
FIG. 3 schematically shows an example of the internal configuration of a battery module 114.

FIG. 3 schematically shows an example of the internal configuration of the battery module 114. In this embodiment, the battery module 114 includes a terminal 202, a terminal 204, an assembled battery 210 and a voltage managing unit 312. In this embodiment, the voltage managing unit 312 includes a balance correction unit 220, a protection unit 230, a DC-DC converter 330, a terminal 242 and a terminal 244. Note that the battery module 116 may have a similar internal configuration to the battery module 114.

In this embodiment, the voltage managing unit 312 is different from the voltage managing unit 212 in (i) that the DC-DC converter 330 is included, (ii) that the DC-DC converter 330 includes the terminal 242 and the terminal 244, (iii) that the terminal 242 and the negative pole end of the assembled battery 210 are not physically connected, and (iv) that the terminal 244 and the positive pole end of the assembled battery 210 are not physically connected. Components of the voltage managing unit 312 may have similar features to those of the voltage managing unit 212, except for the above-described differences.

The battery module 114 may be an example of a second electric storage device. The voltage managing unit 312 may be an example of a management device. The DC-DC converter 330 may be an example of an electricity sending/receiving unit. The DC-DC converter 330 may be an example of a voltage adjusting unit.

In this embodiment, the DC-DC converter 330 sends/receives electric power between the assembled battery 210 in the battery module 114 and at least one of the other battery modules via the electric power transmitting bus 140. For example, the DC-DC converter 330, without disconnecting or shifting an electrical connection between (a) the assembled battery 210 and (b-1) a load which uses electric power of the assembled battery 210 or (b-2) a charging device which charges the assembled battery 210, (i) sends electric power of the assembled battery 210 to at least one of the battery module 112 and the battery module 116, or (ii) receives electric power supplied to the assembled battery 210 from at least one of the battery module 112 and the battery module 116. The DC-DC converter 330 may adjust voltages to be sent or received to any value.

In this embodiment, the DC-DC converter 330 may start sending or receiving electricity in response to receiving a signal for starting sending or receiving electricity. The DC-DC converter 330 may stop sending or receiving electricity in response to receiving a signal for stopping sending or receiving electricity. For example, the DC-DC converter 330 starts sending or receiving electricity or stops sending or receiving electricity based on a signal φ32 from the system control unit 130. The signal φ32 may be a signal including information indicating to start an operation and information indicating whether to perform an electricity sending operation or to perform an electricity receiving operation. The signal φ32 may be a signal indicating to start an electricity sending operation. The signal φ32 may be a signal indicating to start an electricity receiving operation. The signal φ32 may be information indicating to stop the operation currently performed.

The details of the DC-DC converter 330 are not particularly limited, and the DC-DC converter 330 may be an insulated DC-DC converter 330. The DC-DC converter 330 may be a bidirectional DC-DC converter. The voltage managing unit 312 may include a plurality of DC-DC converters 330.

The DC-DC converter 330 may be a forward DC-DC converter, or may be a flyback DC-DC converter. In the battery pack 100, the battery module 112, the battery module 114 and the battery module 116 may have different rated voltages. Therefore, the DC-DC converter 330 is preferably a flyback DC-DC converter having a wide range of available voltage.

The DC-DC converter 330 may be a self-commutated DC-DC converter, or may be an externally-commutated DC-DC converter. The DC-DC converter 330 may be an asynchronous-rectification DC-DC converter, or may be a synchronous-rectification DC-DC converter. Methods of controlling the DC-DC converter 330 are not particularly limited, but it is preferable to perform a constant-current control. Details of an embodiment of the DC-DC converter 330 will be described later.

The battery module 112 described in relation to FIG. 2 does not include the DC-DC converter 330. However, the battery module 112 is not limited by the above-described embodiment. The battery module 112 may have a similar configuration to the battery module 114. It is preferable that at least one of the battery module 112, the battery module 114 and the battery module 116 includes a bidirectional DC-DC converter.

Figure 4:
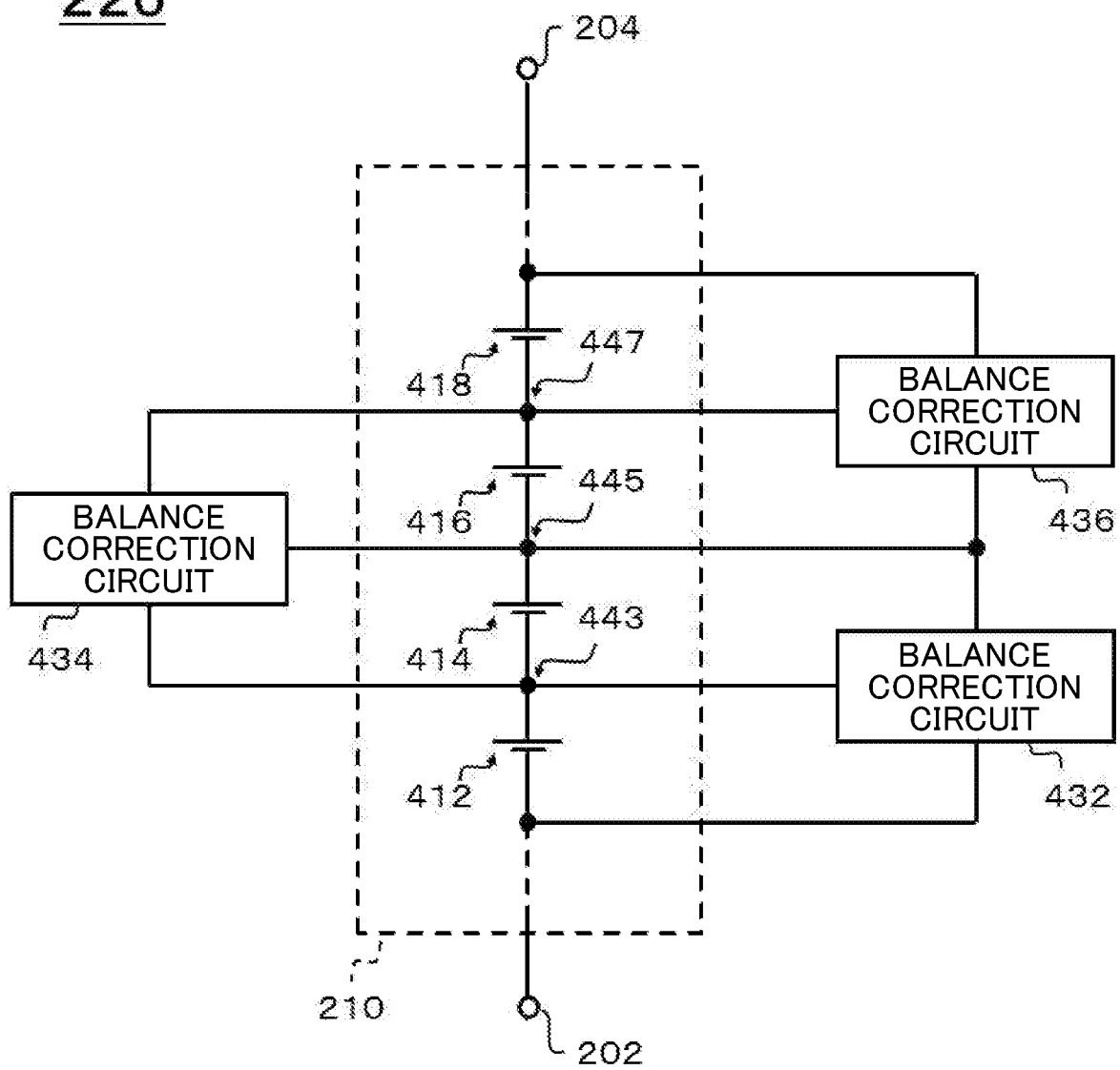
FIG. 4 schematically shows an example of the internal configuration of a balance correction unit 220.

FIG. 4 schematically shows an example of the internal configuration of the balance correction unit 220. FIG. 4 shows an example of the internal configuration of the balance correction unit 220, together with the terminal 202, the terminal 204 and the assembled battery 210. In this embodiment, the assembled battery 210 is constituted of a plurality of electric storage cells connected in series, including an electric storage cell 412, an electric storage cell 414, an electric storage cell 416 and an electric storage cell 418. In this embodiment, the balance correction unit 220 includes a plurality of balance correction circuits including a balance correction circuit 432, a balance correction circuit 434 and a balance correction circuit 436. The balance correction circuit 432, the balance correction circuit 434 and the balance correction circuit 436 may be an example of a balance correction device.

In this embodiment, the balance correction circuit 432 equalizes the voltages of the electric storage cell 412 and the electric storage cell 414. In this embodiment, the balance correction circuit 432 is electrically connected to one end of the electric storage cell 414 closer to the terminal 204 (which may be referred to as the positive pole side of the electric storage cell 414). The balance correction circuit 432 is electrically connected to a connection point 443 between one end of the electric storage cell 414 closer to the terminal 202 (which may be referred to as the negative pole side of the electric storage cell 414) and the positive pole side of the electric storage cell 412. The balance correction circuit 432 is electrically connected to the negative pole side of the electric storage cell 412.

This embodiment describes a case where the balance correction circuit 432 equalizes the voltages of two adjacent electric storage cells. However, the balance correction circuit 432 is not limited by this embodiment. In another embodiment, the balance correction circuit 432 may equalize the voltages of any two electric storage cells selected from three or more electric storage cells connected in series.

In this embodiment, the balance correction circuit 434 equalizes the voltages of the electric storage cell 414 and the electric storage cell 416. The balance correction circuit 434 is electrically connected to the connection point 443, a connection point 445 between the positive pole side of the electric storage cell 414 and the negative pole side of the electric storage cell 416, and a connection point 447 between the positive pole side of the electric storage cell 416 and the negative pole side of the electric storage cell 418. The balance correction circuit 434 may have a similar configuration to the balance correction circuit 432.

In this embodiment, the balance correction circuit 436 equalizes the voltages of the electric storage cell 416 and the electric storage cell 418. The balance correction circuit 436 is electrically connected to the connection point 445, the connection point 447 and the positive pole side of the electric storage cell 418. The balance correction circuit 436 may have a similar configuration to the balance correction circuit 432.

Figure 5:
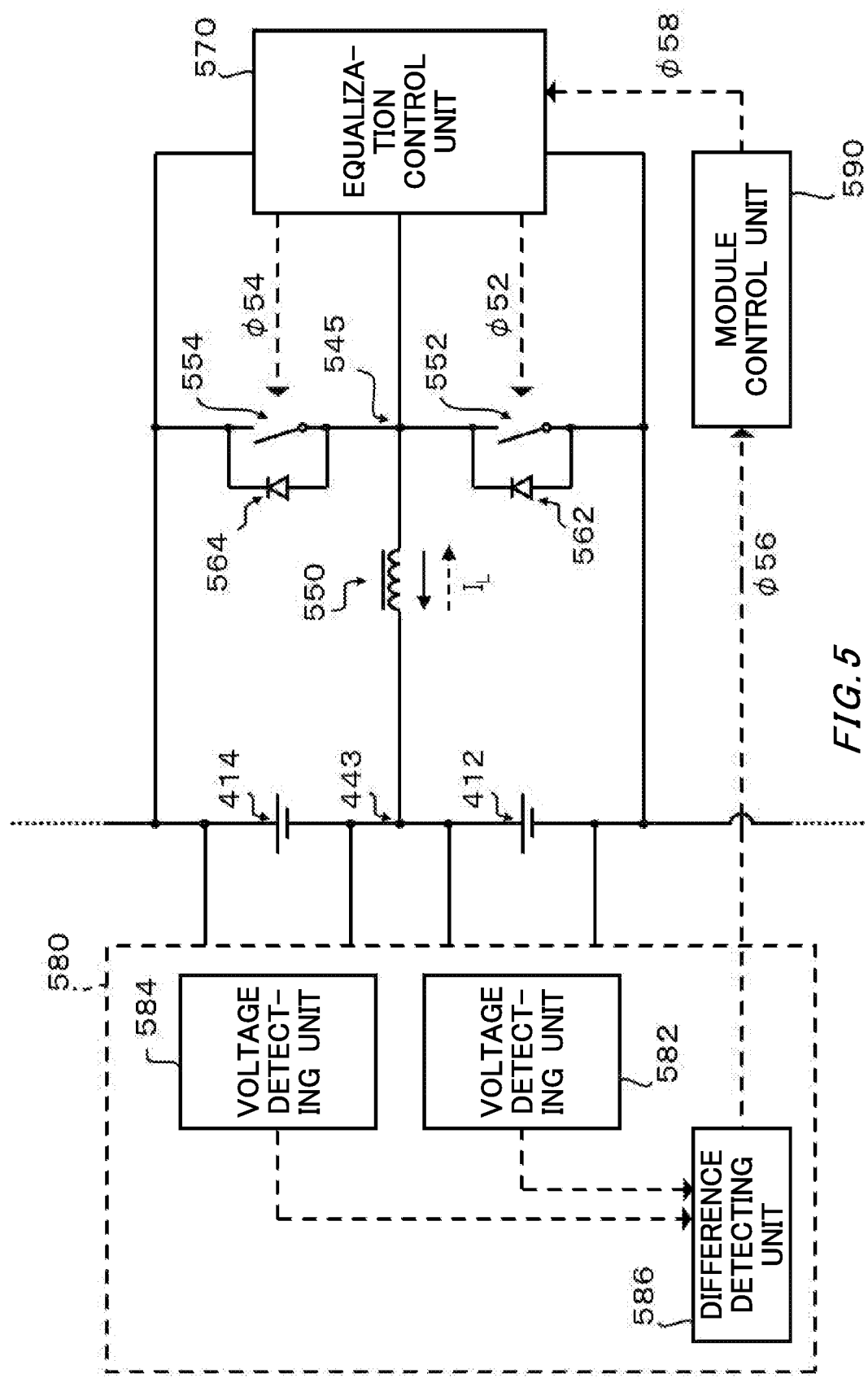
FIG. 5 schematically shows an example of the internal configuration of a balance correction circuit 432.

FIG. 5 schematically shows an example of the internal configuration of the balance correction circuit 432. FIG. 5 shows an example of the internal configuration of the balance correction circuit 432, together with the electric storage cell 412, and the electric storage cell 414. In this embodiment, the balance correction circuit 432 includes an inductor 550, a switching element 552, a switching element 554 and an equalization control unit 570. The balance correction circuit 432 may include a diode 562 and a diode 564. The balance correction circuit 432 may include a voltage monitoring unit 580. The voltage monitoring unit 580 includes, for example, a voltage detecting unit 582, a voltage detecting unit 584 and a difference detecting unit 586. The balance correction circuit 432 may include a module control unit 590.

The equalization control unit 570, and the switching element 554 and the switching element 552 may be placed on physically the same substrate, or may be placed on physically different substrates. The equalization control unit 570 and the module control unit 590 may be formed on physically the same substrate, or may be formed on physically different substrates.

This embodiment describes a case where the balance correction circuit 432 includes the equalization control unit 570 and the module control unit 590. However, the balance correction circuit 432 is not limited by this embodiment. In another embodiment, the equalization control unit 570 may have at least part of the function of the module control unit 590, and the balance correction circuit 432 may not include the module control unit 590. In yet another embodiment, the module control unit 590 may have at least part of the function of the equalization control unit 570, and the balance correction circuit 432 may not include the equalization control unit 570.

This embodiment describes a case where (i) a resistor provided at an appropriate position in a first circuit including the electric storage cell 414, the inductor 550, and the switching element 554 or the diode 564, and (ii) a resistor provided at an appropriate position in a second circuit including the electric storage cell 412, the inductor 550, and the switching element 552 or the diode 562 are used as a current detecting unit for detecting inductor current flowing in the inductor 550. The above-described resistors may be shunt resistors.

However, the current detecting unit is not limited by this embodiment. In another embodiment, at least one of the internal resistance of the switching element 552 and the internal resistance of the switching element 554 may be used as the current detecting unit. In yet another embodiment, the current detecting unit may be an ammeter which detects current flowing in the inductor 550 and transmits a signal including information indicating the current value of the inductor 550 to the equalization control unit 570.

One of the electric storage cell 412 and the electric storage cell 414 may be an example of a first electric storage cell constituting a plurality of electric storage cells.

The other of the electric storage cell 412 and the electric storage cell 414 may be an example of a second electric storage cell constituting a plurality of electric storage cells. The balance correction circuit 432 may be an example of a balance correction device. One of the switching element 552 and the switching element 554 may be an example of a first switching element. The other of the switching element 552 and the switching element 554 may be an example of a second switching element. One of the diode 562 and the diode 564 may be an example of a rectifying unit or a first rectifying unit. The other of the diode 562 and the diode 564 may be an example of a rectifying unit or a second rectifying unit. The equalization control unit 570 may be an example of an equalization unit.

In this embodiment, the balance correction circuit 432 is electrically connected to (i) the positive pole side of the electric storage cell 414, (ii) the connection point 443 between the negative pole side of the electric storage cell 414 and the positive pole side of the electric storage cell 412 and (iii) the negative pole side of the electric storage cell 412. In this manner, a first open/close circuit including the electric storage cell 414, the switching element 554 and the inductor 550 is formed. A second open/close circuit including the electric storage cell 412, the inductor 550 and the switching element 552 is also formed. The connection point 443 may be an example of a connection point between one end of the first electric storage cell and one end of the second electric storage cell.

In this embodiment, the inductor 550 is arranged between the electric storage cell 414 and the switching element 554, and connected in series to the electric storage cell 414 and the switching element 554. In this manner, the inductor 550 and the switching element 554 cooperate to adjust the voltage of at least one of the electric storage cell 412 and the electric storage cell 414. In this embodiment, one end of the inductor 550 is electrically connected to the connection point 443. The other end of the inductor 550 is electrically connected to a connection point 545 between the switching element 552 and the switching element 554.

According to this embodiment, the switching element 552 and the switching element 554 are alternately and repeatedly turned on and off, and thereby an inductor current $I_L$ is generated in the inductor 550. In this manner, electrical energy can be transferred between the electric storage cell 412 and the electric storage cell 414 via the inductor 550. As a result, the voltages of the electric storage cell 412 and the electric storage cell 414 can be equalized.

In this embodiment, the switching element 552 is electrically connected between the other end of the inductor 550 and the negative pole side of the electric storage cell 412. The switching element 552 receives a drive signal φ52 from the equalization control unit 570, and is turned on or off based on the drive signal φ52. The second open/close circuit is opened and closed in association with the operation of the switching element 552. The switching element 552 may be a semiconductor transistor such as a MOSFET.

In this embodiment, the switching element 554 is electrically connected between the other end of the inductor 550 and the positive pole side of the electric storage cell 414. The switching element 554 receives a drive signal φ54 from the equalization control unit 570, and is turned on or off based on the drive signal φ54. The first open/close circuit is opened and closed in association with the operation of the switching element 554. The switching element 554 may be a semiconductor transistor such as a MOSFET.

In this embodiment, the diode 562 is electrically connected between the other end of the inductor 550 and the negative pole side of the electric storage cell 412. The diode 562 is arranged in parallel with the switching element 552. If the switching element 552 is a semiconductor element such as a MOSFET, the diode 562 may be a parasitic diode which is equivalently formed between the source and drain of the switching element 552.

In this embodiment, the diode 562 passes current in a direction from the negative pole side of the electric storage cell 412 toward the other end of the inductor 550. On the other hand, the diode 562 does not pass current in a direction from the other end of the inductor 550 toward the negative pole side of the electric storage cell 412. That is, current flowing in a direction from the negative pole side of the electric storage cell 412 toward the positive pole side of the electric storage cell 412 can pass through the diode 562, while current flowing in a direction from the positive pole side of the electric storage cell 412 toward the negative pole side of the electric storage cell 412 can not pass through the diode 562.

In this embodiment, the diode 564 is electrically connected between the other end of the inductor 550 and the positive pole side of the electric storage cell 414. The diode 564 is arranged in parallel with the switching element 554. If the switching element 554 is a semiconductor element such as a MOSFET, the diode 564 may be a parasitic diode which is equivalently formed between the source and drain of the switching element 554.

In this embodiment, the diode 564 passes current in a direction from the other end of the inductor 550 toward the positive pole side of the electric storage cell 414. On the other hand, the diode 564 does not pass current in a direction from the positive pole side of the electric storage cell 414 toward the other end of the inductor 550. That is, current flowing in a direction from the negative pole side of the electric storage cell 414 toward the positive pole side of the electric storage cell 414 can pass through the diode 564, while current flowing in a direction from the positive pole side of the electric storage cell 414 toward the negative pole side of the electric storage cell 414 can not pass through the diode 564.

As the balance correction circuit 432 includes the diode 562 and the diode 564, even if the inductor current $I_L$ remains in the first circuit or the second circuit during a period of time in which both the switching element 552 and the switching element 554 are turned off, the inductor current $I_L$ can continue to flow in the circuit through the diode 562 or the diode 564. In this manner, the balance correction circuit 432 can fully use the inductor current $I_L$ once generated in the inductor 550. Also, the balance correction circuit 432 can suppress generation of a surge voltage when the inductor current $I_L$ is shut down.

In this embodiment, the equalization control unit 570 controls the balance correction circuit 432 by controlling at least one of the switching element 552 and the switching element 554. For example, the equalization control unit 570 controls at least one of the switching element 552 and the switching element 554 based on an operation control signal φ58 from the module control unit 590.

In this embodiment, the equalization control unit 570 supplies the switching element 552 with the drive signal φ52 for controlling the switching element 552 to be turned on and off. Also, the equalization control unit 570 supplies the switching element 554 with the drive signal φ54 for controlling the switching element 554 to be turned on and off.

In an embodiment, the equalization control unit 570 supplies the drive signal φ52 and the drive signal φ54 such that the switching element 552 and the switching element 554 are alternately (or complementarily) and repeatedly turned on and off. In this manner, while the balance correction circuit 432 operates, a switching operation is repeatedly performed such that a state in which current flows in the first circuit and a state in which current flows in the second circuit are alternately shifted.

In another embodiment, the equalization control unit 570 supplies the drive signal φ52 and the drive signal φ54 such that one of the switching element 552 and the switching element 554 is repeatedly turned on and off and the other of the switching element 552 and the switching element 554 stays turned off. In this manner, while the balance correction circuit 432 operates, a switching operation is repeatedly performed such that a state in which current flows in the first circuit and a state in which current flows in the second circuit are alternately shifted.

For example, if the operation control signal φ58 indicates to transfer charges from the electric storage cell 414 to the electric storage cell 412, the equalization control unit 570 supplies the drive signal φ52 and the drive signal φ54 such that the switching element 554 is repeatedly turned on and off and the switching element 552 stays turned off. In this case, the inductor current flows in the second circuit via the diode 562. On the other hand, if the operation control signal φ58 indicates to transfer charges from the electric storage cell 412 to the electric storage cell 414, the equalization control unit 570 supplies the drive signal φ52 and the drive signal φ54 such that the switching element 552 is repeatedly turned on and off and the switching element 554 stays turned off. In this case, the inductor current flows in the first circuit via the diode 564.

The equalization control unit 570 may generate various control signals used to control the balance correction circuit 432 by combining the drive signal φ52 and the drive signal φ54. In an embodiment, the equalization control unit 570 generates a first control signal for turning on the switching element 554 and turning off the switching element 552. In another embodiment, the equalization control unit 570 generates a second control signal for turning off the switching element 554 and turning on the switching element 552. In yet another embodiment, the equalization control unit 570 generates a third control signal for turning off the switching element 554 and turning off the switching element 552. Each of the first control signal, the second control signal and the third control signal may be configured by the drive signal φ52 and the drive signal φ54.

For example, the equalization control unit 570 controls the balance correction circuit 432 such that, while the balance correction circuit 432 operates, the balance correction circuit 432 repeatedly performs the following switching operation. Also, for example, the equalization control unit 570 controls the balance correction circuit 432 such that, while the balance correction circuit 432 stops, the balance correction circuit 432 stops the switching operation.

For example, the equalization control unit 570 supplies the switching element 552 and the switching element 554 with the drive signal φ52 and the drive signal φ54 such that, during an operating period of the balance correction circuit 432, the balance correction circuit 432 repeatedly performs the switching operation at a predetermined periodic time. Here, the "predetermined periodic time" does not only mean that a periodic time for repeating the switching operation is preset, but also means that the periodic time is varied by any predetermined algorithm or the periodic time is varied by any analog circuit arranged in advance.

For example, even if any information in the present cycle and a predetermined particular algorithm or particular analog circuit determine a periodic time for the subsequent cycle, the periodic time may be an example of the "predetermined periodic time". Also, even if a particular algorithm or particular analog circuit determines a timing to shift at least one of a first operation, a second operation and a third operation included in the switching operation to another operation, the periodic time of the switching operation may be an example of the "predetermined periodic time". The above-described periodic time may be determined based on, for example, (i) the voltage or SOC of at least one of the electric storage cell 412 and the electric storage cell 414, (ii) the current value of current flowing in the inductor 550 and (iii) combinations thereof.

The switching operation may include (i) a first operation in which the switching element 554 is turned on and the switching element 552 is turned off, and (ii) a second operation in which the switching element 554 is turned off and the switching element 552 is turned on. The switching operation may include, in addition to the first operation and the second operation, a third operation in which both the switching element 554 and the switching element 552 are turned off. The order of the first operation, second operation and third operation may be arbitrarily determined, but it is preferable to perform the second operation following the first operation. The switching operation may include another operation that is different from the first operation, second operation and third operation described above.

In this embodiment, the voltage monitoring unit 580 monitors the voltage of at least one of the electric storage cell 412 and the electric storage cell 414. In this embodiment, the voltage monitoring unit 580 detects the voltage of the electric storage cell 412 and the voltage of the electric storage cell 414 by using the voltage detecting unit 582 and the voltage detecting unit 584. The voltage monitoring unit 580 inputs the voltage of the electric storage cell 412 and the voltage of the electric storage cell 414 to the difference detecting unit 586, and detects the voltage difference between the electric storage cell 412 and the electric storage cell 414. The voltage monitoring unit 580 generates a signal φ56 indicating the detected voltage difference and sends it to the module control unit 590. The signal φ56 may include information indicating whether the voltage of the electric storage cell 412 or the voltage of the electric storage cell 414 is greater. The signal φ56 may include information indicating the voltage of the electric storage cell 412 and the voltage of the electric storage cell 414.

In this embodiment, the module control unit 590 controls the balance correction circuit 432. The module control unit 590 may control the balance correction circuit 432 via the equalization control unit 570. The module control unit 590 may send, to the system control unit 130, information indicating the voltage of the electric storage cell 412 and the voltage of the electric storage cell 414. The module control unit 590 may send, to the system control unit 130, information indicating the voltage of the electric storage cell 412 and the voltage of the electric storage cell 414 via a corresponding channel selector (the channel selector 122, the channel selector 124 or the channel selector 126, for example).

In an embodiment, the module control unit 590 determines a direction to transfer charges. For example, the module control unit 590 determines, based on the voltages or SOCs of the electric storage cell 412 and the electric storage cell 414, (i) to transfer charges from the electric storage cell 414 to the electric storage cell 412 or (ii) to transfer charges from the electric storage cell 412 to the electric storage cell 414. The module control unit 590 may send, to the equalization control unit 570, the operation control signal φ58 including information indicating a direction to transfer charges.

In another embodiment, the module control unit 590 estimates a net amount of charges transferred between the electric storage cell 412 and the electric storage cell 414 (which may be referred to as transfer amount of charges). For example, the module control unit 590 estimates the transfer amount of charges based on (i) an operating time of the balance correction circuit 432 and (ii) an actual measured value or estimated value of the current value of current that flowed in the inductor 550. The module control unit 590 may control the balance correction circuit 432 based on the estimated value of the transfer amount of charges. The module control unit 590 may send, to the equalization control unit 570, the operation control signal φ58 including information indicating the estimated value of the transfer amount of charges. The module control unit 590 may be an example of a charge transfer amount estimating device which estimates, based on an operating time of the balance correction device and the value of a valley in the absolute value of the current value of the inductor current during an operating period of the balance correction device or a target condition of the valley, a net amount of charges transferred between two electric storage cells during the operating period of the balance correction device.

The module control unit 590 may estimate the time from when the balance correction circuit 432 is operated until when it is stopped. For example, the module control unit 590 estimates, based on the voltage difference between the electric storage cell 414 and the electric storage cell 412 immediately before or after the balance correction circuit 432 is operated and the estimated value of the transfer amount of charges, the time from when the balance correction circuit 432 is operated until when it is stopped. The module control unit 590 may be an example of a working time estimating device which estimates, based on the voltage difference between two electric storage cells subject to operation of the balance correction device operates and the value of a valley in the absolute value of the current value of the inductor current during an operating period of the balance correction device or a target condition of the valley, the time until the balance correction device is stopped or the time at which it is stopped.

In yet another embodiment, the module control unit 590 determines at least one of whether or not to operate the balance correction circuit 432 and whether or not to stop the balance correction circuit 432. The module control unit 590 sends, to the equalization control unit 570, the operation control signal φ58 including information indicating at least one of whether or not to operate the balance correction circuit 432 and whether or not to stop the balance correction circuit 432.

[Timing to Operate the Balance Correction Circuit 432]

In this embodiment, the module control unit 590 sends, to the equalization control unit 570, the operation control signal φ58 including information indicating to operate the balance correction circuit 432 which is stopping. For example, the module control unit 590 sends the above-described operation control signal φ58 to the equalization control unit 570 at a timing to operate the balance correction circuit 432. The module control unit 590 may send, to the equalization control unit 570, the operation control signal φ58 including information indicating a timing to operate the balance correction circuit 432 and information indicating to operate the balance correction circuit 432 at the timing.

The module control unit 590 may determine, based on the voltages or SOCs of the electric storage cell 412 and the electric storage cell 414, a timing to operate the balance correction circuit 432 which is stopping. For example, the module control unit 590 determines, when the voltage or SOC of at least one of the electric storage cell 412 and the electric storage cell 414 satisfies a predetermined first condition, to operate the balance correction circuit 432. Examples of the above-described first condition can include (i) a condition that the difference between the voltages or SOCs of the electric storage cell 412 and the electric storage cell 414 is greater than a predetermined first value, (ii) a condition that the voltage or SOC of at least one of the electric storage cell 412 and the electric storage cell 414 matches a value determined according to the voltages or SOCs of the electric storage cell 412 and the electric storage cell 414, and the like.

[Timing to Stop the Balance Correction Circuit 432]

In this embodiment, the module control unit 590 sends, to the equalization control unit 570, the operation control signal φ58 including information indicating to stop the balance correction circuit 432 which is operating. For example, the module control unit 590 sends the above-described operation control signal φ58 to the equalization control unit 570 at a timing to stop the balance correction circuit 432. The module control unit 590 may send, to the equalization control unit 570, the operation control signal φ58 including information indicating a timing to stop the balance correction circuit 432 and information indicating to stop the balance correction circuit 432 at the timing.

This embodiment describes a case where the balance correction circuit 432 equalizes the voltages of the electric storage cell 412 and the electric storage cell 414 using the inductor 550, the switching element 552 and the switching element 554. However, the balance correction circuit 432 is not limited by this embodiment. The balance correction circuit 432 may equalize the voltages the of the electric storage cell 412 and the electric storage cell 414 in a known equalization manner or in an equalization manner to be developed in the future. In an embodiment, a balance correction circuit which releases energy of an electric storage cell having a higher voltage by using resistance is used. In another embodiment, a balance correction circuit which transfers charges by using a transformer is used.

Figure 6:
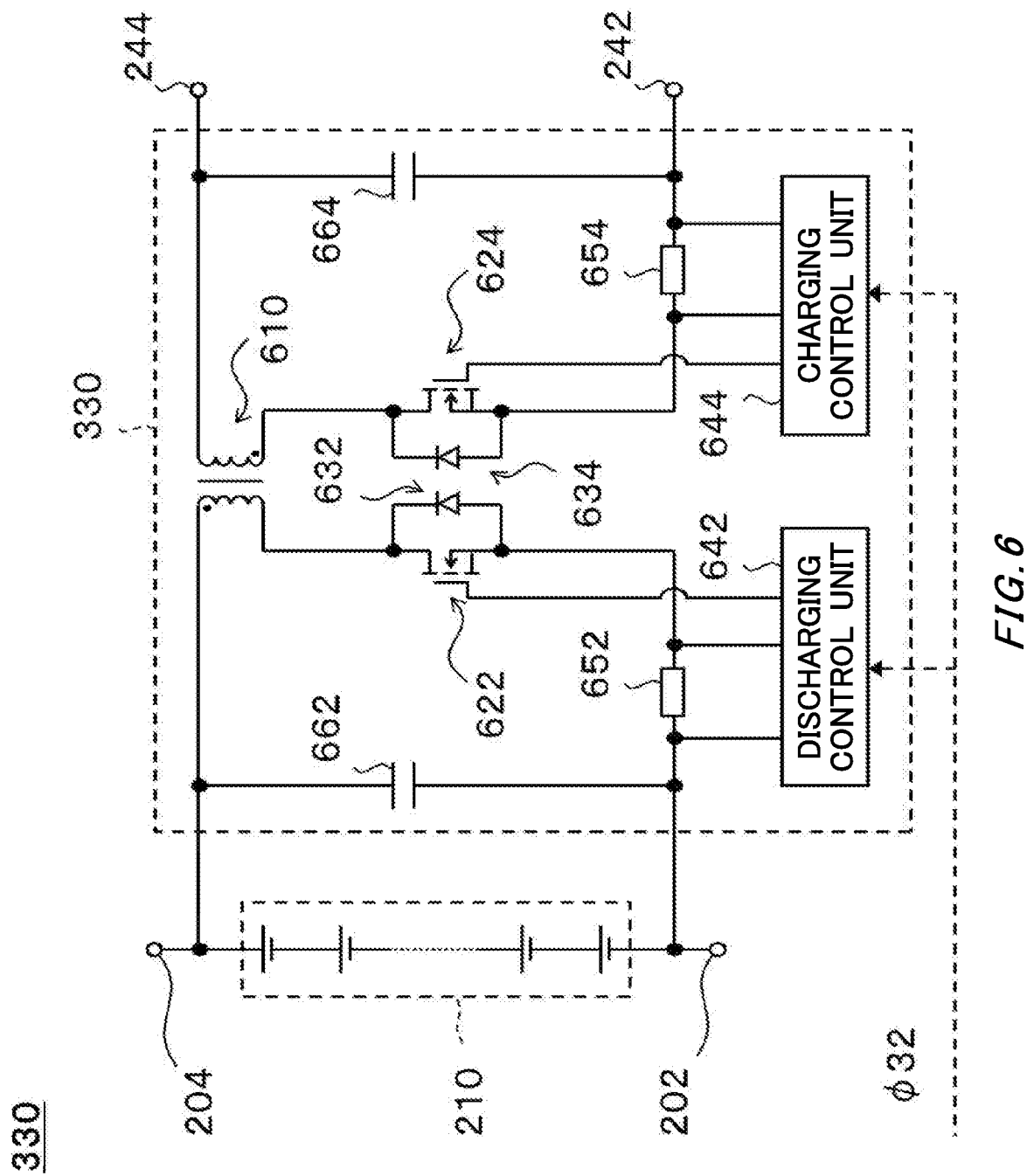
FIG. 6 schematically shows an example of the internal configuration of a DC-DC converter 330.

FIG. 6 schematically shows an example of the internal configuration of the DC-DC converter 330. In this embodiment, the DC-DC converter 330 includes a transformer 610. In this embodiment, the DC-DC converter 330 includes a switching element 622, a diode 634, a discharging control unit 642, a current detecting unit 652 and a capacitor 662. In this manner, electric power of the assembled battery 210 can be supplied to another battery module.

In this embodiment, the DC-DC converter 330 includes a switching element 624, a diode 632, a charging control unit 644, a current detecting unit 654 and a capacitor 664. In this manner, electric power supplied from another battery module can be used to charge the assembled battery 210.

In this embodiment, the transformer 610 includes two coils. The transformer 610 transmits energy from one coil to the other coil. Also, the transformer 610 transmits energy from the other coil to one coil.

In this embodiment, one end of one coil in the transformer 610 is electrically connected to the positive pole end of the assembled battery 210. The other end of one coil in the transformer 610 is electrically connected to one end of the switching element 622. The other end of the switching element 622 is electrically connected to the negative pole end of the assembled battery 210.

In this embodiment, one end of the other coil in the transformer 610 is electrically connected to the terminal 244. The other end of the other coil in the transformer 610 is electrically connected to one end of the switching element 624. The other end of the switching element 624 is electrically connected to the terminal 242.

In this embodiment, the switching element 622 is turned on and off based on a signal from the discharging control unit 642. The switching element 622 may be a semiconductor transistor such as a MOSFET. In this embodiment, the switching element 624 is turned on and off based on a signal from the charging control unit 644. The switching element 624 may be a semiconductor transistor such as a MOSFET.

In this embodiment, the diode 632 is electrically connected between the other end of one coil in the transformer 610 and the negative pole end of the assembled battery 210. The diode 632 is arranged in parallel with the switching element 622. If the switching element 622 is a semiconductor element such as a MOSFET, the diode 632 may be a parasitic diode which is equivalently formed between the source and drain of the switching element 622. In this embodiment, the diode 632 passes current in a direction from the negative pole end of the assembled battery 210 toward the positive pole end of the assembled battery 210. On the other hand, the diode 632 does not pass current in a direction from the positive pole end of the assembled battery 210 toward the negative pole end of the assembled battery 210.

In this embodiment, the diode 634 is electrically connected between the other end of the other coil in the transformer 610 and the terminal 242. The diode 634 is arranged in parallel with the switching element 624. If the switching element 624 is a semiconductor element such as a MOSFET, the diode 634 may be a parasitic diode which is equivalently formed between the source and drain of the switching element 624. In this embodiment, the diode 634 passes current in a direction from the terminal 242 toward the terminal 244. On the other hand, the diode 634 does not pass current in a direction from the terminal 244 toward the terminal 242.

In this embodiment, the discharging control unit 642 controls the switching element 622. For example, the discharging control unit 642 generates a signal for controlling the switching element 622 to be turned on and off, and sends the generated signal to the switching element 622. The discharging control unit 642 may include a pulse width modulator. The discharging control unit 642 may generate the above-described signal using the pulse width modulator.

In an embodiment, the discharging control unit 642 acquires information indicating the magnitude of current flowing in the transformer 610 from the current detecting unit 652. The discharging control unit 642 may generate, based on information indicating the magnitude of current flowing in the transformer 610, a signal for controlling the switching element 622 to be turned on and off.

For example, the discharging control unit 642 generates a signal for controlling the switching element 622 to be turned on and off such that the magnitude of current flowing in one coil in the transformer 610 satisfies a predetermined condition. The predetermined condition may be a condition that the magnitude of current flowing in one coil in the transformer 610 is substantially equal to the rated current value of the DC-DC converter 330.

In another embodiment, the discharging control unit 642 generates a signal for controlling the switching element 622 to be turned on and off such that the voltage between the terminal 242 and the terminal 244 satisfies a predetermined condition. Examples of the predetermined condition can include a condition that the voltage between the terminal 242 and the terminal 244 is substantially equal to a predetermined value, a condition that the voltage between the terminal 242 and the terminal 244 is within a predetermined range, and the like.

In this embodiment, the charging control unit 644 controls the switching element 624. For example, the charging control unit 644 generates a signal for controlling the switching element 624 to be turned on and off, and sends the generated signal to the switching element 624. The charging control unit 644 may include a pulse width modulator. The charging control unit 644 may generate the above-described signal using the pulse width modulator.

In an embodiment, the charging control unit 644 acquires information indicating the magnitude of current flowing in the transformer 610 from the current detecting unit 652. The charging control unit 644 may generate, based on information indicating the magnitude of current flowing in the transformer 610, a signal for controlling the switching element 624 to be turned on and off.

For example, the charging control unit 644 generates a signal for controlling the switching element 624 to be turned on and off such that the magnitude of current flowing in the other coil in the transformer 610 satisfies a predetermined condition. The predetermined condition may be a condition that the magnitude of current flowing in the other coil in the transformer 610 is substantially equal to the rated current value of the DC-DC converter 330.

In another embodiment, the charging control unit 644 generates a signal for controlling the switching element 624 to be turned on and off such that the voltage applied to the assembled battery 210 satisfies a predetermined condition. Examples of the predetermined condition can include a condition that the voltage applied to the assembled battery 210 is substantially equal to a predetermined value, a condition that the voltage applied to the assembled battery 210 is within a predetermined range, and the like.

In this embodiment, the current detecting unit 652 detects current flowing in one coil in the transformer 610. The current detecting unit 652 provides the discharging control unit 642 with information indicating the magnitude of the detected current. In this embodiment, the current detecting unit 654 detects current flowing in the other coil in the transformer 610. The current detecting unit 652 provides the discharging control unit 642 with information indicating the magnitude of the detected current.

In this embodiment, one end of the capacitor 662 is electrically connected to one end of one coil in the transformer 610. The other end of the capacitor 662 is electrically connected to the other end of the switching element 622. The capacitor 662 is arranged in parallel with the assembled battery 210. In this embodiment, one end of the capacitor 664 is electrically connected to one end of the other coil in the transformer 610. The other end of the capacitor 664 is electrically connected to the other end of the switching element 624. The capacitor 664 is arranged in parallel with the assembled battery 210.

Figure 7:
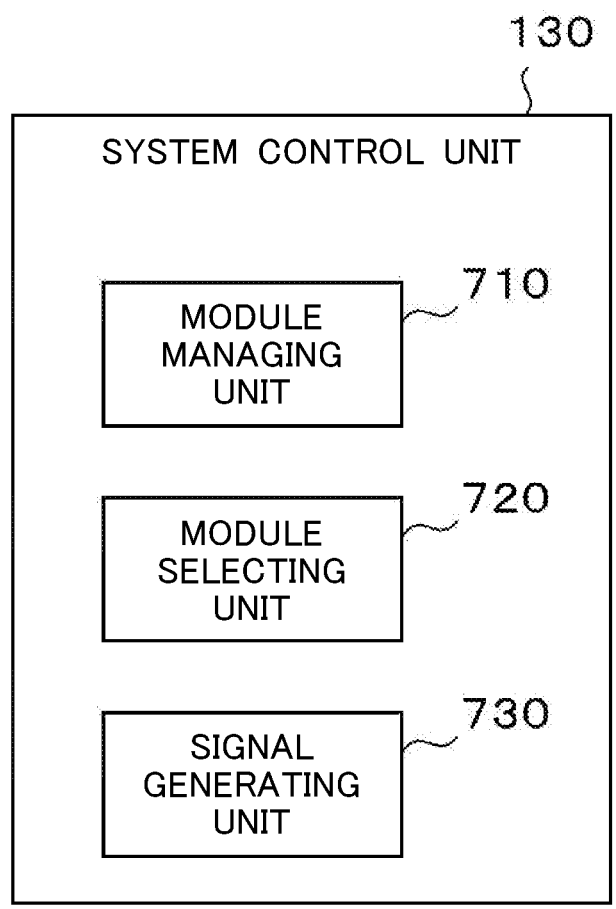
FIG. 7 schematically shows an example of the internal configuration of a system control unit 130.

FIG. 7 schematically shows an example of the internal configuration of the system control unit 130. In this embodiment, the system control unit 130 includes a module managing unit 710, a module selecting unit 720 and a signal generating unit 730. The module selecting unit 720 may be an example of a determining unit. The signal generating unit 730 may be an example of an instruction generating unit.

The module managing unit 710 manages the condition of battery modules included in the battery pack 100. For example, the module managing unit 710 collects information indicating at least one of the voltages and States of Charge of the battery module 112, the battery module 114 and the battery module 116. The module managing unit 710 may collect information indicating at least one of the voltage and State of Charge of each of a plurality of electric storage cells constituting the assembled battery 210 in each module. The module managing unit 710 may store, in a storage device, information indicating at least one of the voltage and State of Charge of each battery module.

The module managing unit 710 may acquire information indicating at least one of the voltage and State of Charge of each battery module from the balance correction unit 220 in each battery module via the channel selector corresponding to each battery module. The module managing unit 710 may acquire information indicating at least one of the voltage and State of Charge of each module from the module control unit 590 of the balance correction unit 220 in each module.

In this embodiment, the module selecting unit 720 determines whether or not to transmit electric power from one or more battery modules to one or more other battery modules. The module selecting unit 720 may select a battery module to send electricity and a battery module to receive electricity.

For example, the module selecting unit 720 determines, based on the voltage or State of Charge of each of a plurality of electric storage cells constituting the assembled battery 210 in each of the battery module 112, the battery module 114 and the battery module 116, (i) a battery module that sends electricity to the electric power transmitting bus 140 and (ii) a battery module that receives electricity from the electric power transmitting bus 140, selecting from the battery module 112, the battery module 114 and the battery module 116. For example, the module selecting unit 720 determines the above-described battery modules based on the voltage or State of Charge of the assembled battery 210 in each battery module.

In this embodiment, the signal generating unit 730 generates a signal for controlling the battery module 112, the battery module 114 and the battery module 116. The signal generating unit 730 may send the generated signal to the battery module to which the signal applies.

In this embodiment, the signal generating unit 730 generates a signal including at least one of (i) an instruction to cause the DC-DC converter 330 in the battery module that sends electricity to the electric power transmitting bus 140 to start an electricity sending operation, and (ii) an instruction to cause the DC-DC converter 330 in the battery module that receives electricity from the electric power transmitting bus 140 to start an electricity receiving operation. The signal generating unit 730 may generate the above-described signal based on the voltage or State of Charge of each of a plurality of electric storage cells constituting each assembled battery 210 in each battery module. The signal generating unit 730 may generate the above-described signal based on the voltage or State of Charge of each assembled battery 210 in each battery module.

In this embodiment, the signal generating unit 730 generates a signal including at least one of (i) an instruction to cause the DC-DC converter 330 in the battery module that sends electricity to the electric power transmitting bus 140 to stop an electricity sending operation, and (ii) an instruction to cause the DC-DC converter 330 in the battery module that receives electricity from the electric power transmitting bus 140 to stop an electricity receiving operation. The signal generating unit 730 may generate the above-described signal based on the voltage or State of Charge of each of a plurality of electric storage cells constituting each assembled battery 210 in each battery module. The signal generating unit 730 may generate the above-described signal based on the voltage or State of Charge of each assembled battery 210 in each battery module.

Figure 8:
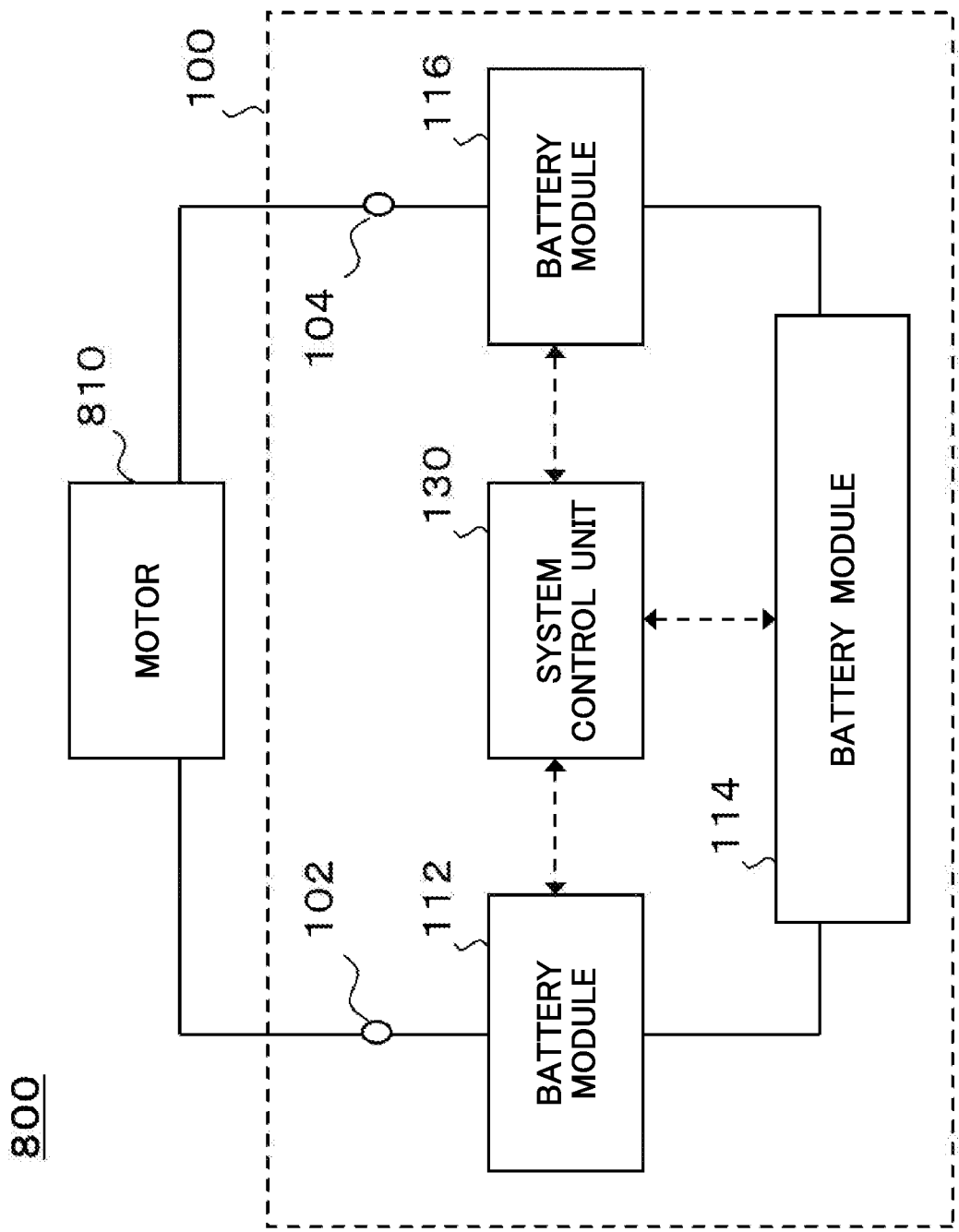
FIG. 8 schematically shows an example of the system configuration of an electric vehicle 800.

FIG. 8 schematically shows an example of the system configuration of an electric vehicle 800. In this embodiment, the electric vehicle 800 includes the battery pack 100 and a motor 810. The electric vehicle 800 may be an example of an electric apparatus operated using electricity. The motor 810 may be an example of a load which uses electric power of the battery pack 100.

In this embodiment, the battery module 112, the battery module 114 and the battery module 116 are arranged at different positions in the electric vehicle 800. The environment surrounding a battery module is different depending on the position at which the battery module is arranged. Examples of the above-described environment can include temperature, humidity, temperature change, humidity change and the like. Therefore, the variation between a plurality of battery modules in their deterioration condition increases over time. As a result, the balance between a plurality of battery modules in their voltages or SOCs may deviate from an originally set value.

However, according to the battery pack 100 in this embodiment, even if the voltages or SOCs of a plurality of battery modules are unbalanced, electric power can be sent/received to/from the plurality of battery modules. In this manner, the performance of the battery pack 100 is recovered. Also, the battery pack 100 can be efficiently used.

Figure 9:
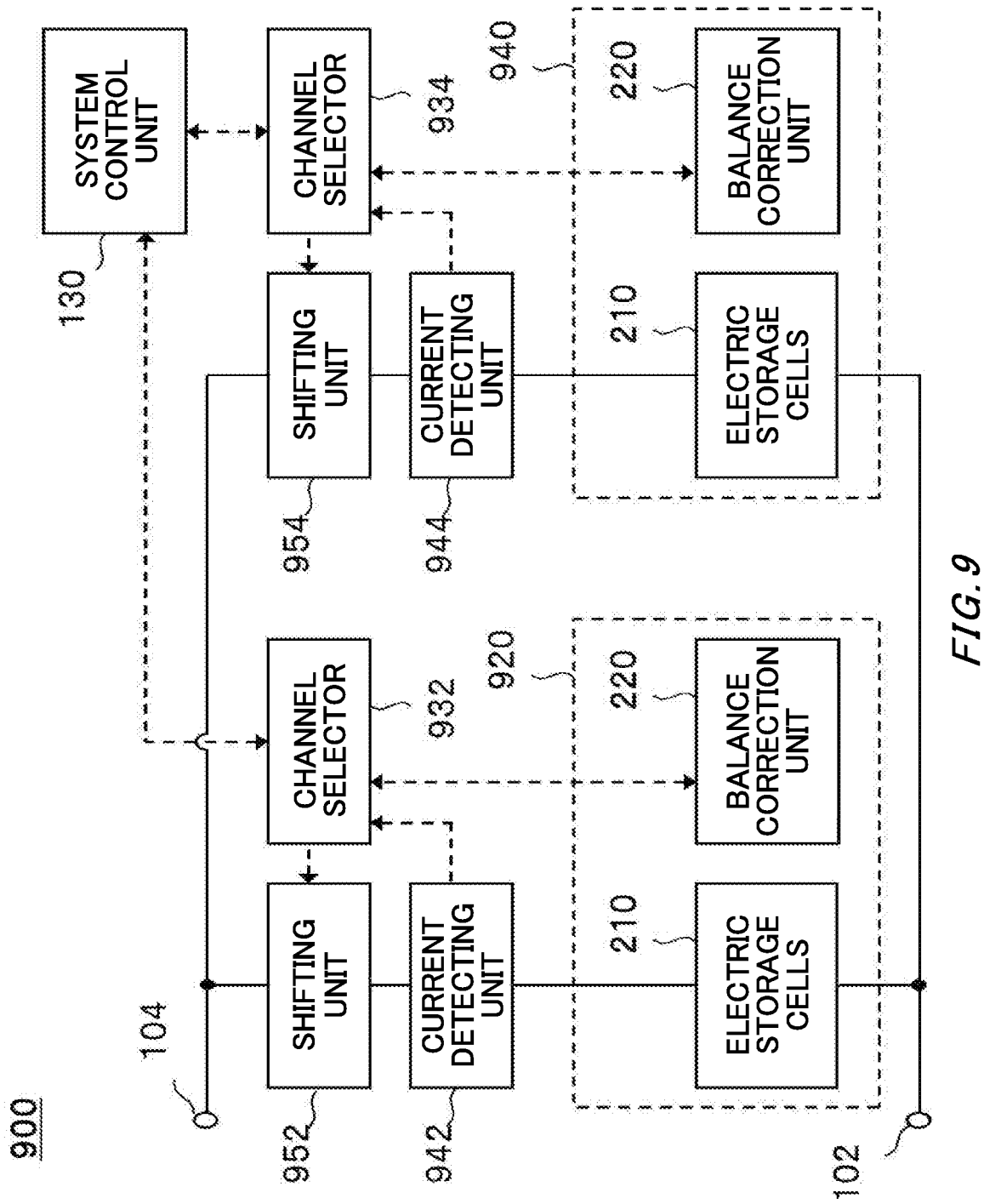
FIG. 9 schematically shows an example of the system configuration of a battery pack 900.

FIG. 9 schematically shows an example of the system configuration of a battery pack 900. In the description of FIG. 1, the embodiment is described where the battery pack 100 includes the system control unit 130 and a plurality of battery modules, each battery module includes an assembled battery 210 and a balance correction unit 220, and assembled batteries 210 in the respective battery modules are connected in series, and in this case the battery pack 100 includes channel selectors corresponding to the respective battery modules.

A battery pack 900 in this embodiment is different from the battery pack 100 in that at least two of a plurality of battery modules are connected in parallel. In this embodiment, the battery pack 900 includes the system control unit 130, a battery module 920 and a battery module 940. Each of the battery module 920 and the battery module 940 includes the assembled battery 210 and the balance correction unit 220.

In this embodiment, the battery pack 900 includes a channel selector 932 corresponding to the battery module 920 and a channel selector 934 corresponding to the battery module 940. The channel selector 932 and the channel selector 934 may have a similar configuration to the channel selector 122, the channel selector 124 or the channel selector 126. The channel selector 932 and the channel selector 934 may send/receive information to/from the system control unit 130.

In this embodiment, the battery pack 900 includes a current detecting unit 942 which detects current flowing in the assembled battery 210 in the battery module 920, and a current detecting unit 944 which detects current flowing in the assembled battery 210 in the battery module 940. The current detecting unit 942 and the current detecting unit 944 may send information indicating the magnitude of the detected current to the system control unit 130. The current detecting unit 942 and the current detecting unit 944 may send information indicating the magnitude of the detected current to the system control unit 130 via the channel selector 932 and the channel selector 934, respectively.

In this embodiment, the battery pack 900 includes a shifting unit 952 which shifts the electrical connection relation between the terminal 104 and the assembled battery 210 in the battery module 920, and a shifting unit 954 which shifts the electrical connection relation between the terminal 104 and the assembled battery 210 in the battery module 940. The shifting unit 952 and the shifting unit 954 may shift the above-described connection relation based on a signal from the system control unit 130. The shifting unit 952 and the shifting unit 954 may receive a signal from the system control unit 130 via the channel selector 932 and the channel selector 934, respectively. Note that the shifting unit 952 may be arranged between the terminal 102 and the assembled battery 210 in the battery module 920. Note that the shifting unit 954 may be arranged between the terminal 102 and the assembled battery 210 in the battery module 940.

While the embodiments of the present invention have been described, the technical scope of the invention is not limited to the above described embodiments. It is apparent to persons skilled in the art that various alterations and improvements can be added to the above-described embodiments. For example, unless a technical contradiction occurs, the matters described in the particular embodiment can be applied to another embodiment. Also, each component may have similar features to another component having the same name and a different reference numeral. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

32: signal, 52: drive signal, 54: drive signal, 56: signal, 58: operation control signal, 100: battery pack, 102: terminal, 104: terminal, 112: battery module, 114: battery module, 116: battery module, 122: channel selector, 124: channel selector, 126: channel selector, 130: system control unit, 140: electric power transmitting bus, 142: low potential bus, 144: high potential bus, 202: terminal, 204: terminal, 210: assembled battery, 212: voltage managing unit, 220: balance correction unit, 230: protection unit, 242: terminal, 244: terminal, 312: voltage managing unit, 330: DC-DC converter, 412: electric storage cell, 414: electric storage cell, 416: electric storage cell, 418: electric storage cell, 432: balance correction circuit, 434: balance correction circuit, 436: balance correction circuit, 438: balance correction circuit, 443: connection point, 445: connection point, 447: connection point, 447: connection point, 545: connection point, 550: inductor, 552: switching element, 554: switching element, 562: diode, 564: diode, 570: equalization control unit, 580: voltage monitoring unit, 582: voltage detecting unit, 584: voltage detecting unit, 586: difference detecting unit, 590: module control unit, 610: transformer, 622: switching element, 624: switching element, 632: diode, 634: diode, 642: discharging control unit, 644: charging control unit, 652: current detecting unit, 654: current detecting unit, 662: capacitor, 664: capacitor, 710: module managing unit, 720: module selecting unit, 730: signal generating unit, 800: electric vehicle, 810: motor, 900: battery pack, 920: battery module, 932: channel selector, 934: channel selector, 940: battery module, 942: current detecting unit, 944: current detecting unit, 952: shifting unit, 954: shifting unit

What is claimed is:

1. An electric storage system comprising:
   a plurality of electric storage cells connected in series to each other;
   a plurality of electric storage devices, each of the plurality of electric storage devices being connected in series to each other, each of the plurality of electric storage devices includes:
      a corresponding plurality of electric storage cells from among the plurality of electric storage cells; and
      a management device configured to manage charging and discharging of the corresponding plurality of electric storage cells;
   an electric power line electrically connectable to each of a plurality of management devices; and
   a controller;
   wherein
      the electric power line includes a low potential bus and a high potential bus, a first electric storage device among the plurality of electric storage devices further includes:
         a first terminal equipotentially connected to the low potential bus and a negative pole end of the corresponding plurality of electric storage cells; and
         a second terminal equipotentially connected to the high potential bus and a positive pole end of the corresponding plurality of electric storage cells;
      each of one or more other electric storage devices except for the first electric storage device, among the plurality of electric storage devices further include:
         an insulated bidirectional DC-DC converter,
         wherein two terminals of a primary side of the insulated bidirectional DC-DC converter are connected to a positive pole end and a negative pole end of the corresponding plurality of electric storage cells, and two terminals of a secondary side of the insulated bidirectional DC-DC converter are connected to the low potential bus and the high potential bus; and
      the controller is configured to control an operation of the DC-DC converter.

2. The electric storage system according to claim 1, wherein
   the insulated bidirectional DC-DC converter provided at each of the one or more other electric storage devices is configured to (i) send electric power of the corresponding plurality of electric storage cells to an external apparatus which is different from the load and the charging device, or (ii) receive electric power supplied to the corresponding plurality of electric storage cells from the external apparatus without disconnecting or shifting an electrical connection between (a) the corresponding plurality of electric storage cells and (b-1)

a load which uses electric power of the corresponding plurality of electric storage cells or (b-2) a charging device which charges the corresponding plurality of electric storage cells, and the external apparatus comprises one or more electric storage cells which are arranged between (a) the corresponding plurality of electric storage cells and (b-1) the load or (b-2) the charging device, and are connected in series to the corresponding plurality of electric storage cells.

3. The electric storage system according to claim 1, wherein the insulated bidirectional DC-DC converter provided at each of the one or more other electric storage devices adjusts a voltage to be sent or received.

4. The electric storage system according to claim 1, wherein the insulated bidirectional DC-DC converter provided at each of the one or more other electric storage devices starts sending or receiving electricity in response to receiving a signal for starting sending or receiving electricity, or stops sending or receiving electricity in response to receiving a signal for stopping sending or receiving electricity.

5. The electric storage system according to claim 1, wherein a rated voltage of the first electric storage device and a rated voltage of at least one of the one or more other electric storage devices are different from each other.

6. The electric storage system according to claim 1, wherein a number of the corresponding plurality of electric storage cells managed by the first electric storage device and a number of the corresponding plurality of electric storage cells managed by at least one of the one or more other electric storage devices are different from each other.

7. An electric apparatus comprising:
the electric storage system according to claim 1; and
a load which uses electric power of the electric storage system.

8. The electric storage system according to claim 1, wherein
the first electric storage device further includes an equalization unit which equalizes voltages of the corresponding plurality of electric storage cells, and
the one or more other electric storage devices further include an equalization unit which equalizes voltages of the corresponding plurality of electric storage cells.

9. The electric storage system according to claim 1, wherein:
the first electric storage device is arranged on a most negative pole side.

10. The electric storage system according to claim 9, wherein
the positive pole end and the negative pole end of the corresponding plurality of electric storage cells in the first electric storage device are physically connected to the electric power line and always electrically connected to the electric power line.

11. The electric storage system according to claim 1, wherein
the insulated bidirectional DC-DC converter includes:
a transformer including a first coil and a second coil, a first end of the first coil being connected to the positive pole end of the corresponding plurality of electric storage cells, and a first end of the second coil being connected to the terminal connected to the high potential bus;
a first switching element, a first end of which is connected to a second end of the first coil, and a second end of which is connected to the negative pole end of the corresponding plurality of electric storage cells;
a first diode, a first end of which is connected to the second end of the first coil, and a second end of which is connected to the negative pole end of the corresponding plurality of electric storage cells, the first diode being configured to pass current in a direction from the negative pole end to the positive pole end;
a second switching element, a first end of which is connected to a second end of the second coil, and a second end of which is connected to the terminal connected to the low potential bus; and
a second diode, a first end of which is connected to the second end of the second coil, and a second end of which is connected to the terminal connected to the low potential bus, the second diode being configured to pass current in a direction from the terminal connected to the low potential bus to the terminal connected to the high potential bus.

12. The electric storage system according to claim 11, wherein
the insulated bidirectional DC-DC converter is a flyback DC-DC converter.

13. The electric storage system according to claim 1, wherein
the electric storage system further comprises
a control unit which controls transmission of electric power among the plurality of electric storage devices.

14. The electric storage system according to claim 13, wherein the control unit determines, based on a voltage or State of Charge (SOC) of each of the corresponding plurality of electric storage cells included in each of the plurality of electric storage devices, (i) an electric storage device that sends electricity to the electric power line and (ii) an electric storage device that receives electricity from the electric power line, selecting from the plurality of electric storage devices; and
generates at least one of (i) an instruction to cause the insulated bidirectional DC-DC converter in the electric storage device that sends electricity to the electric power line to start an electricity sending operation, and (ii) an instruction to cause the insulated bidirectional DC-DC converter in the electric storage device that receives electricity from the electric power line to start an electricity receiving operation.

15. The electric storage system according to claim 14, wherein:
the control unit determines, based on a voltage or State of Charge (SOC) of each of the corresponding plurality of electric storage cells included in each of the plurality of electric storage devices, at least one of (i) an electric storage device that stops the electricity sending operation and (ii) an electric storage device that stops the electricity receiving operation; and
the control unit generates at least one of (i) an instruction to cause the insulated bidirectional DC-DC converter in the electric storage device that stops the electricity sending operation to stop an electricity sending operation, and (ii) an instruction to cause the insulated bidirectional DC-DC converter in the electric storage device that stops the electricity receiving operation to stop an electricity receiving operation.

16. The electric storage system according to claim 13, wherein
first identification information is provided to each of the plurality of electric storage cells among all of the plurality of electric storage devices, the first identification information being different from each other, second identification information is provided to each of the plurality of electric storage cells, the second identification information being different from each other within the respective electric storage device, and when first identification information corresponding to at least one electric storage cell is received from the controller, a corresponding one of the plurality of management devices identifies second identification information corresponding to the at least one electric storage cell based on the received first identification information.

17. The electric storage system according to claim 16, wherein the first identification information provided to each of the plurality of electric storage cells is (i) different from the second identification information or (ii) identical to the second identification information.

18. The electric storage system according to claim 16, wherein when second identification information corresponding to at least one electric storage cell is received from the controller, the controller identifies first identification information corresponding to the at least one electric storage cell based on the received second identification information.

19. The electric storage system according to claim 18, wherein one of the plurality of management devices includes a storage unit which stores at least one of the first identification information and the second identification information.

* * * * *